United States Patent
Wakefield

(10) Patent No.: US 7,137,547 B2
(45) Date of Patent: Nov. 21, 2006

(54) PROCESS FOR FORMING ELECTRICAL/MECHANICAL CONNECTIONS

(76) Inventor: Elwyn Paul Michael Wakefield, Brackenfel, 18 Westfield Road, Toftwood, Derehem, Norfolk NR19, 1JB (GB)

( * ) Notice: Subject to any disclaimer, the term of this patent is extended or adjusted under 35 U.S.C. 154(b) by 0 days.

(21) Appl. No.: 10/257,842

(22) PCT Filed: Apr. 17, 2001

(86) PCT No.: PCT/GB01/01737

§ 371 (c)(1),
(2), (4) Date: Mar. 21, 2003

(87) PCT Pub. No.: WO01/82362

PCT Pub. Date: Nov. 1, 2001

(65) Prior Publication Data

US 2003/0159276 A1 Aug. 28, 2003

(30) Foreign Application Priority Data

| Apr. 20, 2000 | (GB) | ................................. 0009839.2 |
| Nov. 23, 2000 | (GB) | ................................. 0028595.7 |
| Apr. 3, 2001 | (GB) | ................................. 0108418.5 |

(51) Int. Cl.
*B23K 31/02* (2006.01)
(52) U.S. Cl. ................. 228/180.5; 228/110.1
(58) Field of Classification Search ............. 228/110.1, 228/4.5, 180.5; 29/827, 832, 861; 174/52.2
See application file for complete search history.

(56) References Cited

U.S. PATENT DOCUMENTS

| 3,373,481 A | | 3/1968 | Lins et al. |
| 5,110,032 A | * | 5/1992 | Akiyama et al. ............ 228/102 |
| 5,192,015 A | * | 3/1993 | Ingle et al. .................. 228/111 |
| 5,195,237 A | | 3/1993 | Cray et al. |
| 5,445,311 A | * | 8/1995 | Trask et al. .................. 228/175 |
| 5,468,927 A | * | 11/1995 | Terakado .................. 219/56.21 |
| 5,558,270 A | | 9/1996 | Nachon et al. |
| 5,871,141 A | | 2/1999 | Hadar et al. |
| 5,884,835 A | * | 3/1999 | Kajiwara et al. ......... 228/110.1 |
| 5,906,308 A | | 5/1999 | Yamazaki et al. |
| 5,938,105 A | | 8/1999 | Singh |

FOREIGN PATENT DOCUMENTS

| EP | 0376924 | 7/1990 |
| GB | 2095473 A | 9/1982 |
| WO | WO 99/04453 | 1/1999 |

* cited by examiner

*Primary Examiner*—Jonathan Johnson
(74) *Attorney, Agent, or Firm*—Rothwell, Figg, Ernst & Manbeck

(57) ABSTRACT

A method of making a connection to a surface of an electronic carrier, the method comprising the steps of: providing a mass of malleable material on the surface of the electronic carrier; connecting the mass to said surface; and extruding the mass into a bore of a tool in order to elongate the mass so as to create a pin, or pin-like, structure having an end to which a further connection may be made.

21 Claims, 22 Drawing Sheets

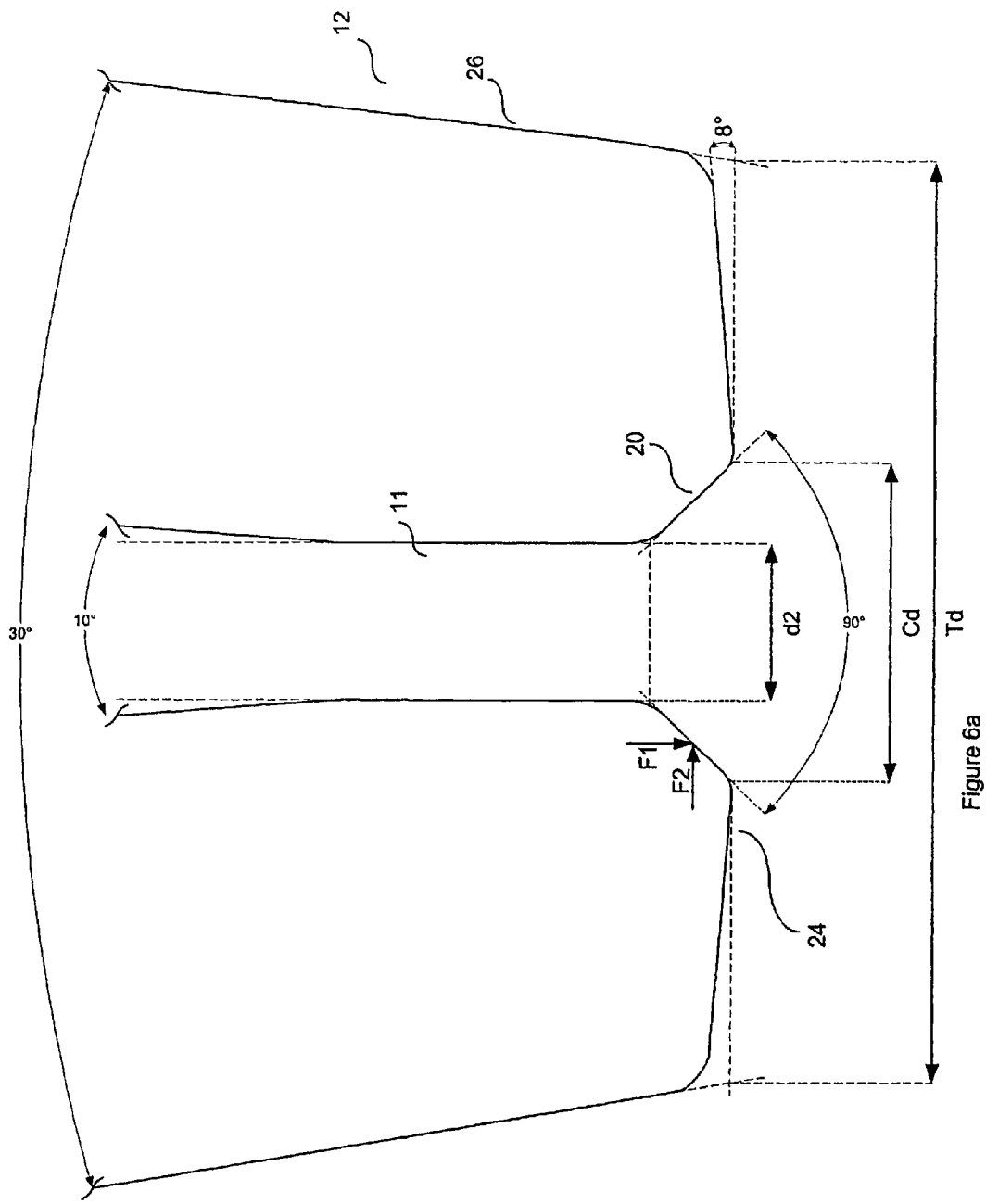

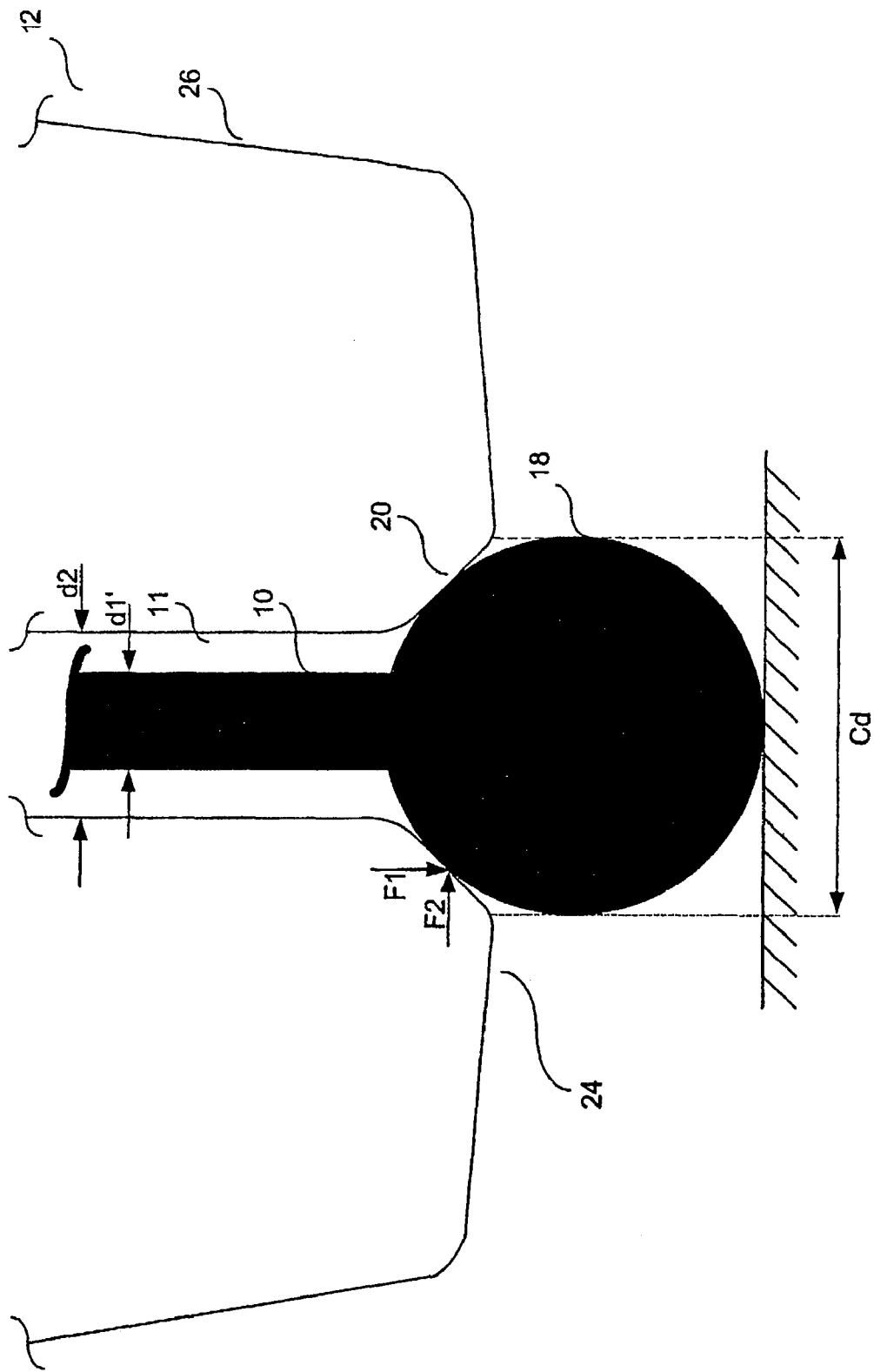

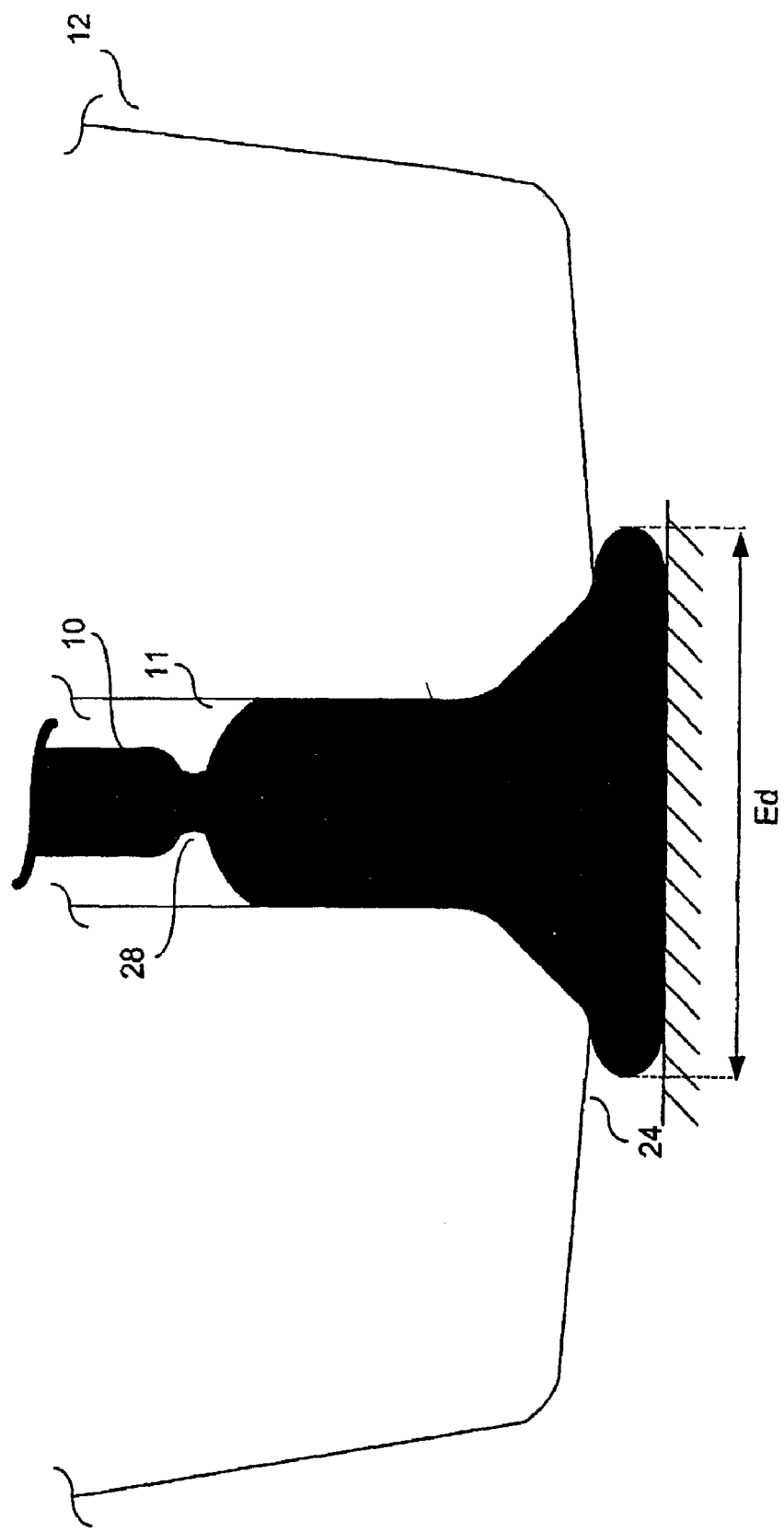

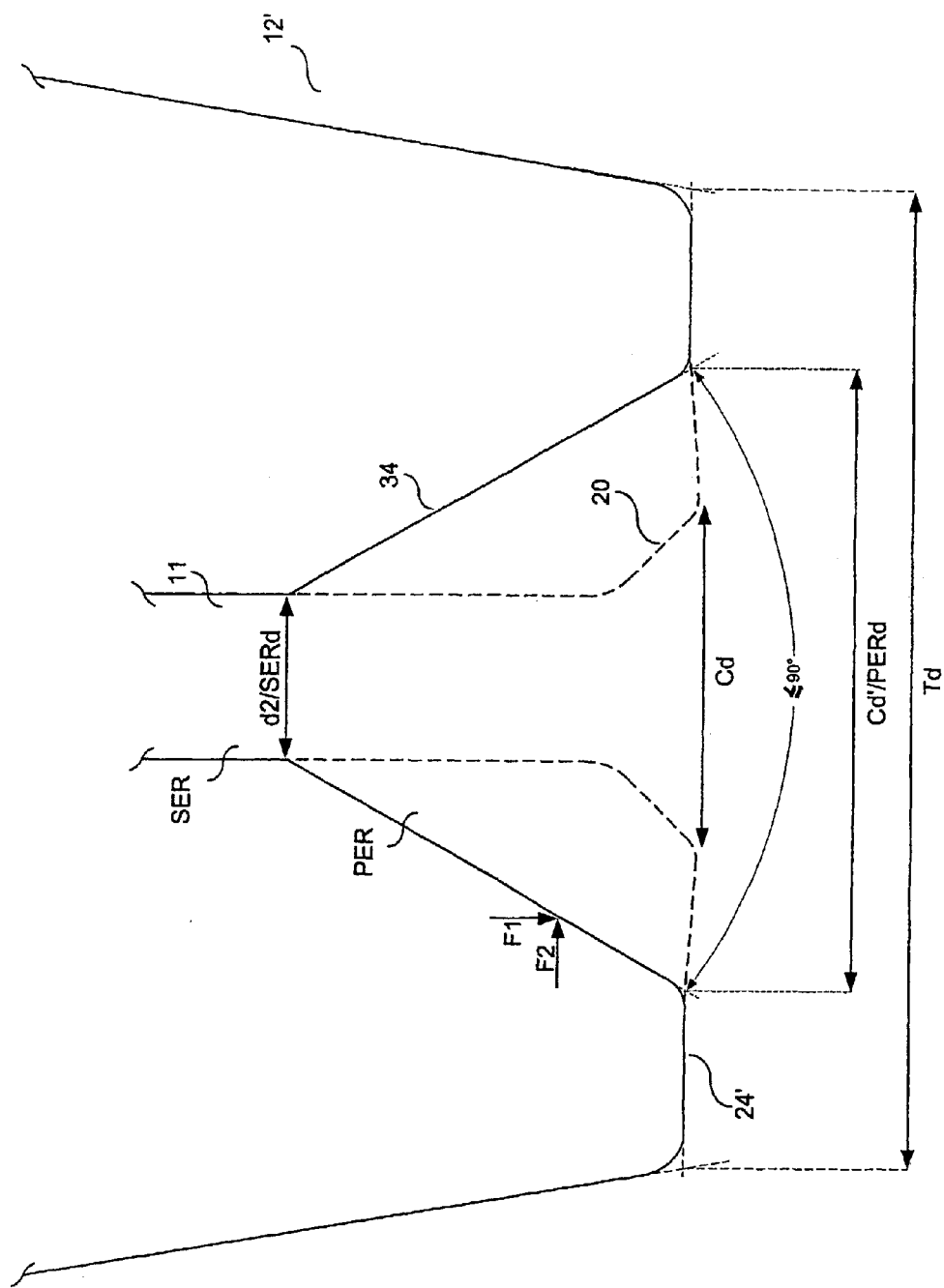

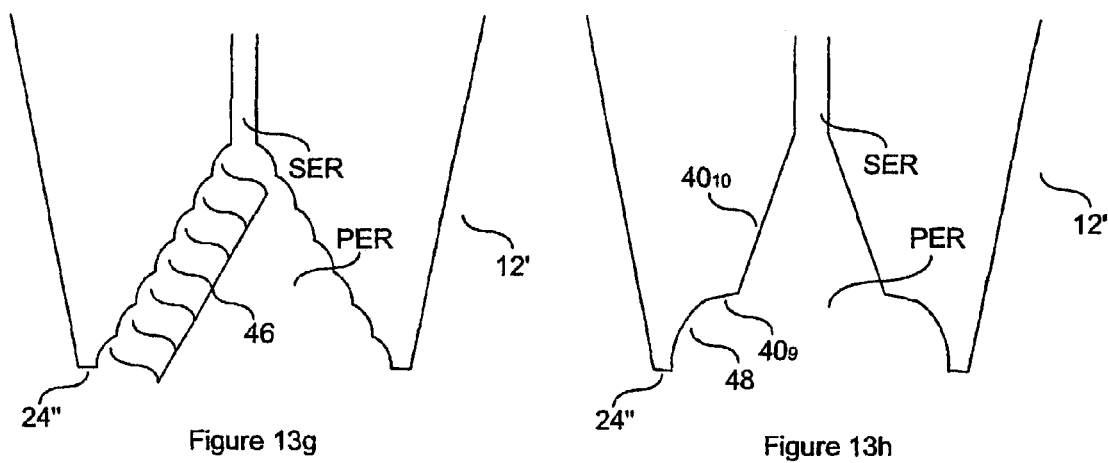

PROCESS FOR FORMING ELECTRICAL/MECHANICAL CONNECTIONS

FIELD OF THE INVENTION

The present invention relates to forming connections, especially electrical and/or mechanical connections. In particular, the present invention relates to an improved method for forming high-density and/or fine pitch connections on surfaces. Such surfaces may be associated with purely mechanical connections or may form part of electronic carriers/substrates such as, but not limited to, integrated circuits (IC's), IC package leadframes, semiconductor wafers, ceramic interposers, printed circuit boards, burn-in boards and the like, including combinations thereof.

BACKGROUND OF THE INVENTION

Particular problems arise with making connections to a host of various different materials and/or surfaces. Adhesives, welding, brazing, soldering, and other forms of bonding, such as thermoplastic bonding, molecular bonding and so on are but a few of the most common techniques available to the man skilled in the art. These examples are not intended to be limiting in any way. Bond strength is a major consideration in the selection of the type of bond and the method of implementing it. The ultimate bond strength can be determined by a variety of factors, such as the nature and properties of the materials to be bonded, the nature and properties of the bonding materials or media, the conditions under which the bonding process is carried out and the conditions of use of the article or device employing the bond once made. Likewise, these examples are not intended to be limiting but are mentioned merely as an aid to understanding the advances made by the present invention.

Although there are general problems, such as those outlined above, which may be encountered in a host of different technologies, there are specific problems that have to be faced in certain, well-defined technologies. One such technology relates to the provision of connections to/from electronic circuitry. These connections are primarily electrical but can also perform the function of a mechanical connection. The converse can also be true. For example, there are currently several known methods for forming electrical/mechanical connections between two carriers such as, for example, an integrated circuit (IC) and a ceramic interposer.

One common method of forming such connections involves bonding suitable conductive wires between bond pads formed on the IC, and respective pads carried by the associated carrier. The wires are bonded using well known thermosonic techniques that utilise ultrasonic and thermal energy to form the required bonds.

A second known method of such connection is known in the art as "bumped die" or "flip chip" bonding. This second method involves the formation of contacts, typically in the form of balls, studs or hemispherical bumps, on the bond pads of the IC. The IC can then be connected to the carrier by bonding the contacts of the IC to appropriate corresponding bonding surfaces of the carrier. The bonding can be carried out using known: thermal compression; thermosonic; soldering; and/or adhesive bonding techniques, including combinations thereof.

A third known method of such connection is known in the art as "tape automated bonding" or "TAB bonding". TAB bonding involves the bonding of a carrier's conductive trace directly onto the bond pads of the IC.

Each of the above three connection methods exhibits disadvantages, especially, for example, when applied to components having high pin counts and/or where there is a need for chip size/scale packages (CSP's). For example, thermosonic wire bonding and TAB bonding methods have a disadvantage in that the bond pads must be placed about the periphery of the IC. Another disadvantage of these methods is that the connections from the IC to the carrier are relatively long, and as such, present many well known and understood problems associated with the routing of signals, especially high frequency signals, due to unwanted parasitic elements. Furthermore, another disadvantage associated with thermosonic wire bonding and TAB bonding techniques is that, as the physical size of an IC gets smaller, the IC becomes bond pad limited. Bond pad limitation occurs when the size of the IC is determined by the number of connections that need to be made between the IC and the carrier, and not by the functionality of the IC. This is still the case even when multiple rows of the finest available pitch (typically less than 100 microns) of bond pads are used. For a given yield of die per wafer, the physical size of the IC directly affects the absolute number of "known good die" (KGD) per wafer, and so being limited to a minimum size by bond pad considerations has serious cost implications and such a situation is therefore undesirable and disadvantageous.

One disadvantage associated with flip chip technology is that it does not permit the use of the same fine pitch bond pads that are currently available for thermosonic wire bonding or TAB bonding connection techniques. Typical pitch values for current flip chip technology are greater than 200 microns. However, flip chip technology does have an advantage over thermosonic wire bonding and TAB bonding techniques in that the positioning of the bond pads is not limited. Using flip chip technology, operative bond pads can be placed, for example, in an area array all over the top surface of an IC. A disadvantage associated with flip chip technology is that the balls, studs or hemispherical bumps, that are employed are limited in height because of the fine pitch requirements i.e. the aspect ratio (AR) of a contact's height (h) to its diameter ($d_3$) is typically less than one (AR h:$d_3$ 1) and quite often less than 0.7. The problem of having contacts with such low value aspect ratios is that the resulting connections of the IC to the carrier, for example, tend to transmit mechanical stresses, caused by the different coefficients of thermal expansion (CTE) of the IC and carrier materials, between the IC and its associated carrier. One solution to the problem associated with the different CTE's of IC and carrier materials is to ensure that the difference between the CTE of the IC and the carrier are within acceptable limits for the size of the IC and its operating temperature range. However, matching such IC and carrier CTE's has an associated disadvantage in that the matching can involve the use of expensive specialist carrier materials. It should be noted that as the semiconductor industry moves towards greater system integration, i.e. system-on-chip and multi-chip-modules, the inherently larger IC's compound the present problems of CTE matching. These larger IC's result in greater mechanical stresses, which results in more attention having to be paid to solving the matching problems associated with the different coefficients of thermal expansion (CTE) of the IC and its associated carrier.

In addition to the problems associated with bump-like connections of an electrical/electronic nature, as discussed above, there are also limitations as regards mechanical integrity and mechanical shock. These problems can also occur in a non-electrical/electronic applications. Prior art connections, whether they are of a mechanical or electrical/electronic nature, are of limited extension (height) relative to the plane on which they are made. Typical aspect ratio figures of less than unity have already been mentioned. One consequence not necessarily related to differential thermal expansion is the inherent rigidity in the transverse direction, i.e. parallel to the plane of the surface and/or device on which the connection is provided. Increasing the height would have the advantageous effect that the lateral stiffness would be reduced, thereby increasing the resistance of the device to lateral forces that might otherwise disturb or damage the connection between the surface and a device or other surface.

In light of the foregoing problems associated with the state of the art, it is desirable to provide an improved method of forming connections, such as electrical/mechanical connections, between a surface and another element, such as a connection between a plurality of electronic carriers. It is also desirable to provide an improved method of forming high stress tolerant electrical/mechanical connections that are suitable for use with a variety of electronic carriers.

SUMMARY OF THE INVENTION

In a first aspect, the invention provides a method of making a connection to a surface, the method comprising: providing a mass of malleable material on the surface; connecting the mass to the surface; and extruding the mass into a bore of a tool to create a pin like structure.

In a second aspect, the invention provides a method of making a connection to a surface, the method comprising: providing a mass of malleable material on the surface; bonding the mass to the surface; and elongating the mass into a bore of a tool to create a pin like structure.

In a third aspect, the invention provides a method of making a connection to a surface, the method comprising: providing a mass of malleable material on the surface; connecting the mass to the surface; and extruding the mass into a bore of a tool, whereby to elongate the mass so as to create a pin like structure having an end to which a further connection may be made.

In a fourth aspect, the invention provides a method of making a connection to a surface, the method comprising: introducing an elongate member into a bore of a tool; providing a mass of malleable material on the exposed end of the elongate member; connecting the mass to the surface; extruding the mass into the bore to create a pin like structure; and disconnecting the elongate member from the pin like structure.

In a fifth aspect, the invention provides a method of forming a connection to a surface on which is connected a mass of malleable material, the method comprising extruding the mass into a bore of a tool, to create a pin like structure.

In each of the first to fifth aspects, the method includes connecting or bonding the mass to the surface and extruding or elongating the mass into the bore.

In the fifth aspect, the elongate member is a wire of the malleable material. The mass of malleable material is formed from the wire, for example by electronic flame off or any other suitable technique.

The mass of malleable material is preferably in the form of a ball. The method may comprise holding the ball in contact with the surface using a predetermined load and applying a first predetermined level of ultrasonic power to the ball for a first predetermined time period.

The method may comprise applying the first predetermined level of ultrasonic power to the ball for an additional, second predetermined time period immediately following the first predetermined time period. Alternatively, the second predetermined level of ultrasonic power may be applied for a third predetermined time period subsequent to the first predetermined time period following a period of rest. The second predetermined level is preferably greater than the first predetermined level.

The bore may have a substantially constant cross section along its length or it may be tapered such that its cross section reduces along the length of the bore in a direction away from the surface. The bore preferably has monotonic curvature. The bore preferably has a chamfer portion extending from the bore and terminating in an open mouth, the chamfer subtending an angle no greater than 90 degrees.

The mouth of the chamfer portion may be no wider in cross section than the width of the ball or the mass of malleable material or it may be the same magnitude as the width of the ball or the mass of malleable material.

The malleable material may be aluminium, aluminium alloy, gold, gold alloy, copper, copper alloy or a tin based solder.

The surface may be part of an integrated circuit, either one of a plurality of integrated circuits on a semiconductor wafer or one that has been singularised from a semiconductor wafer.

The surface may be part of an electronic interposer, part of a ceramic interposer, part of a printed circuit board, or part of an electronic carrier.

The pin-like structure is preferably connected or bonded to the surface through the intermediary of a pre-existing bond formed on the surface.

The mass of malleable material may comprise a plurality of consecutively formed masses of malleable material, whereby to create a pin like structure of elevated height after the extrusion or elongation step.

The invention, in a sixth aspect, comprises a pin like structure formed on a surface by the method according to any of the preceding paragraphs.

The invention also provides, in a seventh aspect, a tool adapted for extruding a ball or mass of malleable material, the tool comprising a body, a bore within the body, a chamfer portion extending from the bore and terminating in a mouth in a tip portion of the body, the mouth being of such shape and size that, in use, the majority of a ball or mass of malleable material located at the entrance to the mouth, will be extruded into the bore.

The mouth of the tool may be of such shape and size that substantially all of the ball or mass of malleable material located at the entrance to the mouth, will be extruded into the bore.

The tool may have a bore of substantially constant width cross section or it may be tapered such that its cross section reduces in width with increasing distance from the tip portion. The bore preferably has monotonic curvature.

The chamfer portion may subtend an angle no greater than 90 degrees.

The bore may be substantially bottle-shaped or substantially frusto-conical. The chamfer portion may be substantially frusto-conical and forms a continuous extension of the bore.

An extension of the bore remote from the tip portion may have a cross section that increases in width with increasing distance from the tip portion.

In an eighth aspect, the invention provides a tool for use in any of the above methods, the tool comprising a body, a bore within the body, a chamfer portion extending from the bore and terminating in a mouth in a tip portion of the body, the mouth being of such shape and size that, in use, the majority of a ball or mass of malleable material located at the entrance to the mouth, will be extruded into the bore.

The mouth is preferably of such shape and size that substantially all of the ball or mass of malleable material located at the entrance to the mouth, will be extruded into the bore.

The tool may have a bore of substantially constant width cross section or it may be tapered such that its cross section reduces in width with increasing distance from the tip portion.

The bore preferably has monotonic curvature. The chamfer portion may subtend an angle no greater than 90 degrees.

The bore may be substantially bottle-shaped or frusto-conical, in which case the chamfer portion may be substantially frusto-conical to form a continuous extension of the bore.

The bore of the above tool may have an extension remote from the tip portion with a cross section that increases in width with increasing distance from the tip portion.

The invention also encompasses articles of manufacture incorporating a pin like structure made or formed by any of the methods defined above. Such articles include, but are not limited to, articles of manufacture incorporating a pin like structure made or formed by any of the methods defined above and using a tool as defined above.

The articles of manufacture preferably include a package in the form of a lead frame, a ceramic Ball Grid Array, an organic Ball Grid Array, a plastic Ball Grid Array, a Direct Chip, Attach device, a Multichip Module, a High-Reliability package, a Chip Scale package, or a Chip Size package.

The invention also encompasses articles of manufacture comprising, but not limited to, articles adapted for use in Industrial/Commercial applications, automotive applications, and High Reliability (Hi-Rel)/Military applications.

The invention also encompasses, but is not limited to, articles of manufacture comprising semiconductor devices, such as silicon based, gallium arsenide based, or silicon germanium based devices.

The articles of manufacture also include articles in which the surface is part of a first electronic carrier, such as a printed circuit board, an integrated circuit, an electronic interposer, a ceramic interposer, or an organic electronic carrier.

An article of manufacture according to the invention may also include a second electronic carrier, wherein the first and second electronic carriers are interconnected through at least one the pin like structure formed on a the surface. Preferably, the second electronic carrier is a printed circuit board, an integrated circuit, a ceramic interposer, an organic interposer, or an electronic interposer.

An article of manufacture may include an article wherein at least one pin like structure according to the invention is made or formed on one of the first and second electronic carriers. At least two the pin like structures may be made or formed on both of the first and second electronic carriers.

Underfill material may be located between the first and second electronic carriers. The underfill material may be a thermoset epoxy or a thermoplastic.

The invention also includes an article consisting of a multi chip module comprising a plurality of first electronic carriers connected to a second electronic carrier, the connections between the first and second electronic carriers being made through a plurality of pin like structures according to the invention. These pin like structures may be formed on the first and/or the second electronic carrier by any method according to the invention. The pin like structures may alternate between the first and the second electronic carriers.

Any of the articles of manufacture or multi chip modules according to the invention may have the free ends of the pin like structures that are connected or bonded to the surface(s) connected to second surface(s) by means of thermocompression, solid state diffusion, solder or conductive (including z-axis conductive)/non-conductive adhesive.

The first and second electronic carriers may each be provided with at least one the pin like structure and wherein the free ends of the pin like structures on the first and second electronic carriers are connected together.

These first and second electronic carriers may be connected together by thermocompression, solid state diffusion, conductive (including z-axis conductive)/non-conductive adhesive or solder.

An article of manufacture comprising a plurality of pin like structures according to the invention may have pin like structures of different heights.

The invention also relates to apparatus incorporating a pin like structure according to the sixth aspect of the invention. Such apparatus includes, but is not limited to, telecommunication apparatus, computer equipment, processing equipment, memory, transport equipment, vehicles, military equipment, satellite equipment, surveillance equipment, control apparatus/equipment, diagnostic apparatus/equipment, and medical apparatus/equipment.

The invention also provides a method of processing a semiconductor wafer comprising a plurality of integrated circuits, the method including the step of providing or forming pin like structures according to the sixth aspect of the invention on at least one of the integrated circuits of the semiconductor wafer.

The step of providing or forming pin like structures on the at least one of the integrated circuits may be carried out whilst the at least one integrated circuit is/are still integrated in the wafer or after the at least one integrated circuit has been singularised from the wafer.

The invention also provides an electronic device comprising at least one integrated circuit having pin like structures bonded thereto, each the pin like structure being according to the sixth aspect of the invention.

In the present specification, the term "malleable" is intended to signify a material that has, as one of its properties, the ability to be reshaped/reformed, for example, a material that is: mouldable; pliable; workable; ductile; pliant; supple or the like.

BRIEF DESCRIPTION OF THE DRAWINGS

FIG. 6a illustrates an example of a state of the art capillary tool;

FIGS. 6b and 6c illustrate one, non-limiting, method of forming a pin, or pin-like, structure, according to the present invention, using the capillary tool illustrated in FIG. 6a;

FIG. 10 illustrates one, non-limiting, example of one possible modification, according to the present invention, that may be carried out to the capillary tool illustrated in FIG. 6a;

FIGS. 13a–13h illustrate some, non-limiting, examples of alternative modifications, according to the present invention, that may be carried out to the capillary tool illustrated in FIG. 6a or 10;

DETAILED DESCRIPTION OF THE PREFERRED EMBODIMENT

It should be noted that the accompanying drawings are not to relative, or absolute, scale and are intended as non-limiting examples, whether singly or in combination.

FIGS. 1 to 4 of the accompanying drawings illustrate, in cross section, a known method of forming and attaching a ball bond to a surface, such as a surface, i.e. a bond pad, of an integrated circuit.

Figure 1:
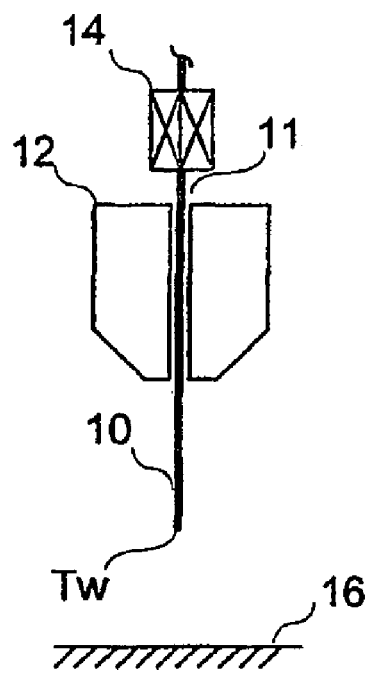
FIGS. 1 to 4 illustrate one known method of forming and attaching connections to a surface.

Referring to FIG. 1, the procedure to form a required connection on a bonding surface 16 of a carrier begins with feeding, from a supply spool (not illustrated), a predetermined amount of wire 10 through a bore 11 of a capillary tool 12 of a thermosonic wire bonding apparatus (not illustrated). The tip Tw of the wire 10 extends beyond the end of a capillary tool 12 by a predetermined amount. The wire 10 is held by clamps 14 that form part of the bonding apparatus.

Figure 2:
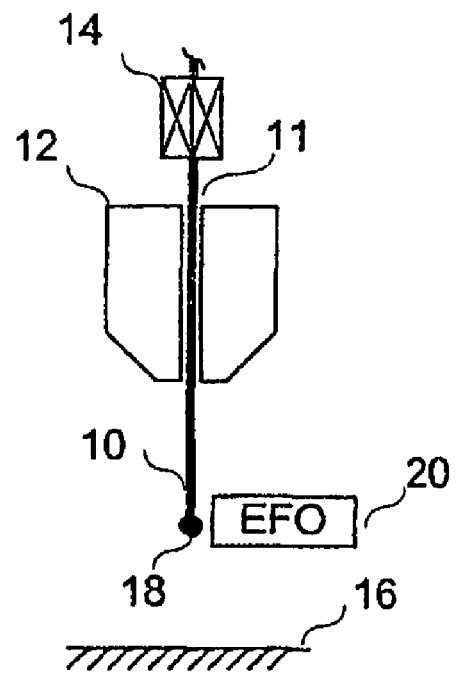

As shown in FIG. 2, a mass, i.e. a ball 18, of material is formed at the tip Tw of the wire 10. Typically, a mechanical arm positions an electrode 20 adjacent to the tip Tw of the wire 10. A high voltage is applied to the electrode 20 such that an arc is produced between the wire 10 and the electrode 20 and a high-voltage electrical current flows between the electrode 20 and the tip Tw of the wire 10. The tip Tw of the wire 10 is thereby operatively melted and a ball 18 of material is operatively formed. This ball forming procedure is known as electronic flame-off (EFO). Alternative methods for forming the ball include hydrogen flame-off or laser heating but any other method that forms a mass of material (18) is suitable for this part of the overall process.

Figure 3:
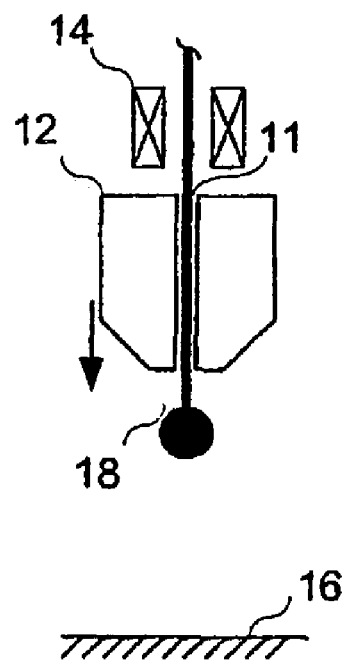

As shown in FIG. 3, the ball 18 "runs" up the wire 10 towards the operative end of the capillary tool 12. The clamps 14 are then released, ready for downward movement (as indicated by the arrow) of the capillary tool 12 in the next step illustrated in FIG. 4. The downward movement of the capillary tool 12 will allow the ball 18 to be engaged by the operative end of the capillary tool 12 at some point during its downward movement and to be "carried" down to meet the bonding surface 16.

Figure 4:
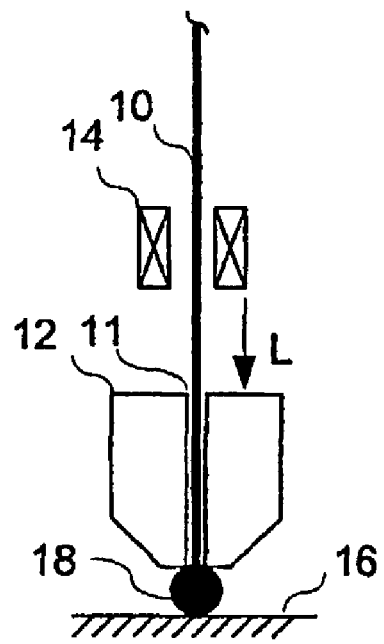

The ball 18 is then bonded to the bonding surface 16, as illustrated in FIG. 4. During this bonding process the bonding apparatus lowers the capillary tool 12 towards the bonding surface 16, thereby holding the ball 18 against the bonding surface. A vertical load L is applied to the capillary tool 12 so that the ball 18 is pressed against the surface 16. The bonding apparatus operates to vibrate the capillary tool 12 at high frequency such that ultrasonic energy is driven through the capillary tool 12. The vibration of the capillary tool 12 serves to vibrate the ball 18 and so "scrub" the ball 18 onto the bonding surface 16. This "scrubbing" action causes "plastic deformation" of the material of the ball 18 so that "atomic interdiffusion" between the ball material and bonding surface 16 occurs, which results in an intimate contact between the ball material and the bonding surface, i.e., which results in an electrical/mechanical connection being formed.

The bonding surface 16 and/or capillary tool 12 can be heated during the scrubbing process in order to aid the formation of the bond. The ultrasonic vibrations applied to the ball 18 cause the ball material to become more pliable in nature. The pliable nature of the ball material means that, since it is under a load L, it deforms to produce a bonding area, as will be illustrated later with reference to FIG. 5a.

Although not illustrated, after the ball 18 has been bonded to the bonding surface 16, the wire 10 is detached from the bonded ball 18. The detachment of the wire 10 from the bonded ball 18 can be achieved using a number of different known techniques. One such technique involves withdrawing the capillary tool 12 from the bond surface 16, while clamping the wire. This clamp and detach method may also employ any of the known techniques of pre-weakening the wire at the appropriate point prior to detachment.

Another technique for detaching the wire 10 from the bonded ball 18 involves withdrawing the capillary tool 12 from the bonding surface 16, without the wire 10 being clamped. The wire 10 is then cut, or severed, at the top of the bonded ball 18. Whichever detachment technique is employed, the wire 10 is then left extending beyond the tip of the capillary tool 12, in preparation for the formation of another ball, and the bonding process is then repeated for the next ball bond.

It will be appreciated by those skilled in the art that the method illustrated in FIGS. 1 to 4 is intended to be a non-limiting example of a basic, known, method of ball bonding and in particular flip chip ball bonding. It will be further appreciated by those skilled in the art that other methods of flip chip and/or ball bonding exist and variations on the steps described above are possible.

As mentioned briefly above, one problem that is associated with bonding connections with different carriers is concerned with the different coefficients of thermal expansion (CTE's) of the carriers, regardless of the die size and/or number of connections, i.e. bonds, to be made. By way of example, a silicon integrated circuit typically has a CTE of between 2–4 ppm/° C., a ceramic interposer typically has a CTE in the range of 5–12 ppm/° C. and a printed circuit board typically has a CTE of 17 ppm/° C. or more. The differences in CTE values effectively limit the size of IC's that can be connected to a carrier by any of the known techniques. For example, mounting a silicon device on a ceramic carrier using known flip chip techniques can lead to high stress levels being placed on the silicon device, because of the differences in thermal expansion of the two materials. Some of the factors that affect the maximum size of IC that can be bonded directly onto a given interposer using the described flip chip bonding technique include, for example: the difference in CTE's of the carriers; the required operating temperature range; the height of the bonds; the materials used to form the bonds; and the presence or absence of an underfill material and, if present, the composition of such underfill material.

In a first method embodying the present invention, the steps illustrated in FIGS. 1 to 4 are first used to form a ball 18 on the end of a wire 10 and then to bond the ball 18 to the bonding surface 16, as already described.

Figure 5A:
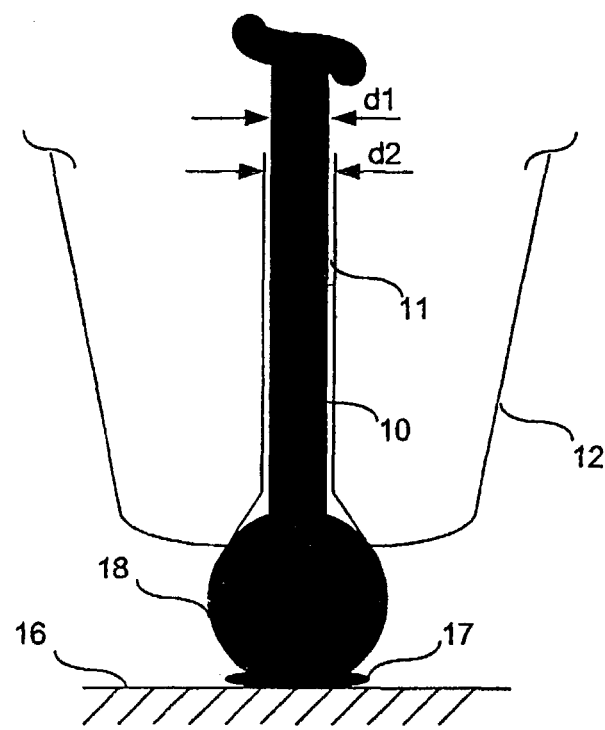
FIG. 5a–5d, illustrate the basic steps in a state of the art ball bonding technique.

Cross sectional FIG. 5a, illustrates in more detail the point at which the ball 18 bonds to the bonding surface 16. The capillary tool 12, through which the wire 10 extends, vibrates and scrubs the ball 18. The ultrasonic vibration of the ball 18 causes the ball to become "plastic" in nature, so that the ball spreads along the bonding surface 16 forming a bonding area 17. As is well known in the art, the spreading of the ball 18 causes the material of the ball 18 to alloy/fuse with the material of the bonding surface thereby producing a bond between the ball 18 and the surface 16.

FIG. 5a illustrates in more detail the capillary tool bore 11, that has a diameter $d_2$, through which the wire 10, having a diameter $d_1$, extends. Typically, the wire diameter d1 is slightly less than that of the bore diameter d2. As can be seen in this figure, the bore 11 of the capillary tool 12 terminates in a small "flared" or "chamfered" region 20 that engages the upper surface of the ball 18. The purpose of this chamfer 20 is to provide a "recess" or "pocket" so as to locate and hold the ball 18 whilst the bonding process is undertaken. The bonded connection provided by this prior art technique results in a ball (hence the expression "ball bond") with little, or no, deformation of the ball material within the recess or pocket (20), as illustrated in, the cross sectional, FIG. 5b.

Figure 5B:
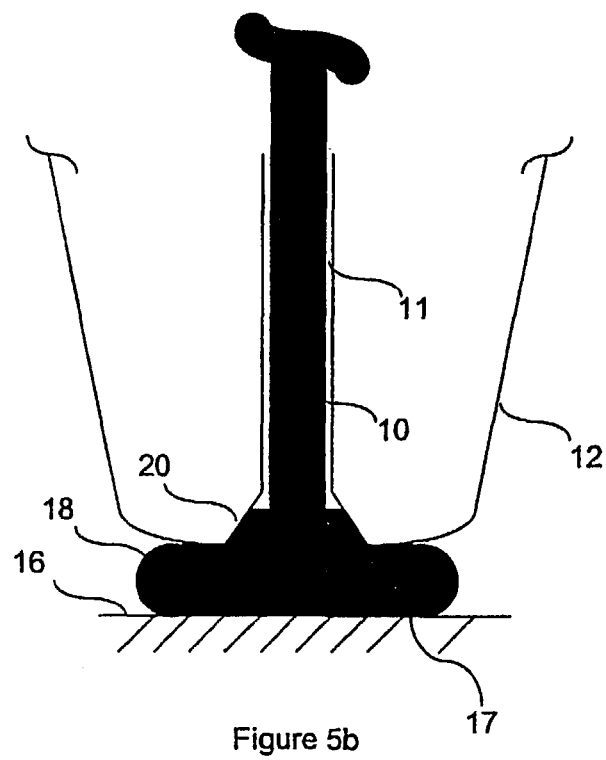

Having made an operative bond as per FIGS. 5a and 5b, the wire 10 is disconnected from the 'reshaped', i.e. 'mashed', ball material. Typically, a relatively small portion 10' of the wire 10 remains on the top surface of the mashed ball 18', as is illustrated in, the cross sectional, FIG. 5c.

Figure 5C:
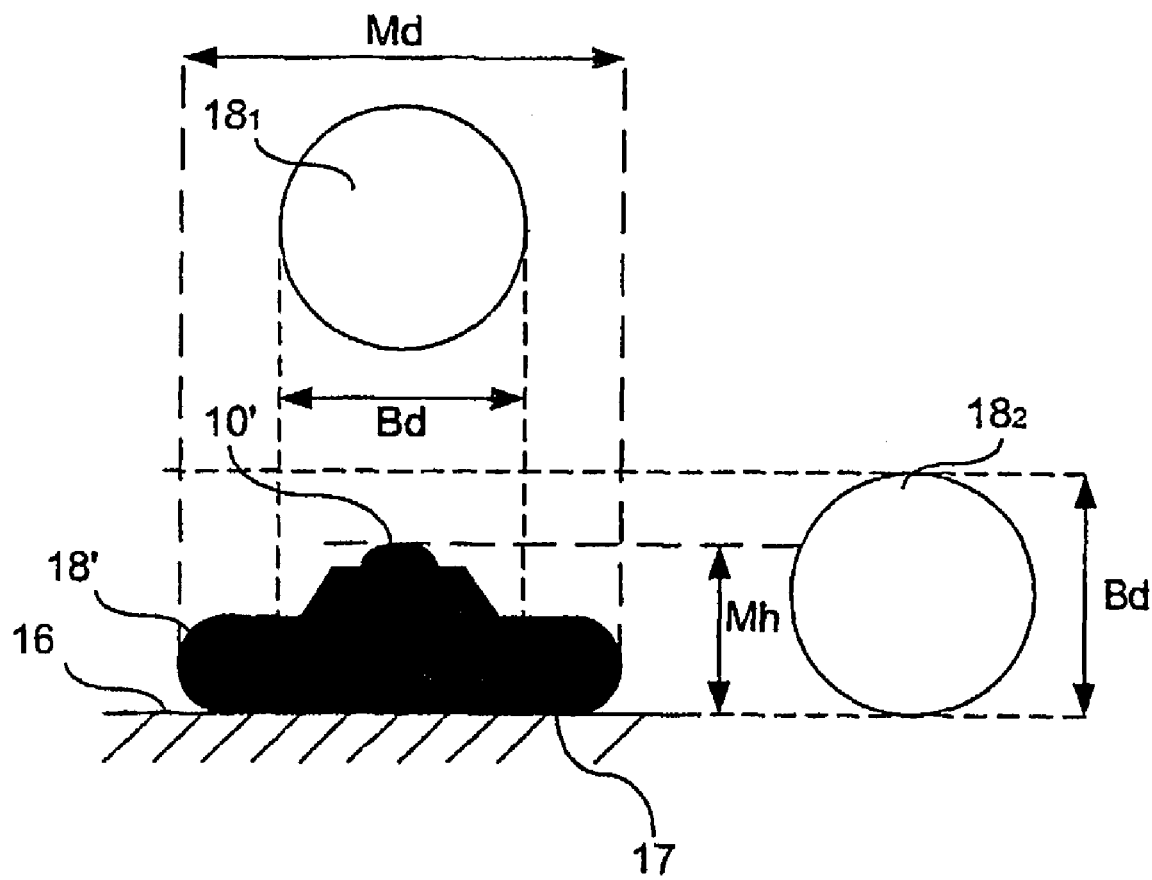

Also illustrated in FIG. 5c are representations $18_1$ and $18_2$ of the original ball 18 that is used as the basis for making such a ball bond. As can be seen, the mashed ball 18' has: a 'mashed diameter' Md that is greater than the original bail diameter Bd; and a 'mashed height' Mh that is less than the original ball diameter Bd.

Figure 5D:
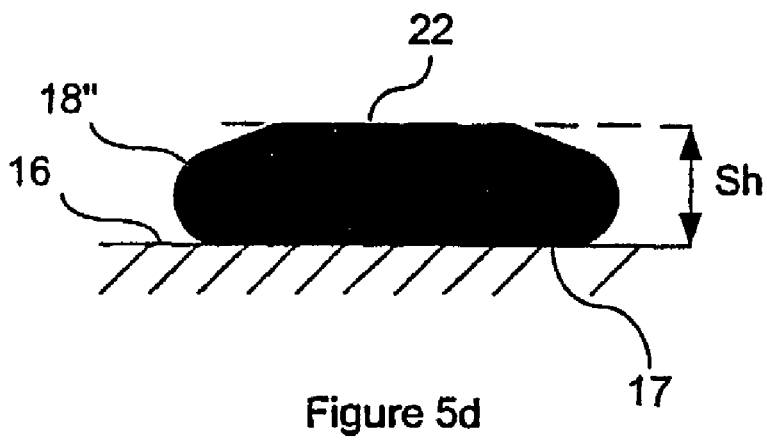

Often, for reasons associated with co-planarity, it is desirable to 'stamp' or 'coin' the top surface of the mashed ball 18' so as to provide a flatter, more reliable and more consistent, bonding surface 22 on the top of the mashed ball 18'. This stamping, or coining, process step results in a slightly different reshaped, 'stamped', ball 18" from that illustrated in FIG. 5c. Furthermore, the 'stamped height' Sh of the stamped ball 18" is less than the mashed height Mh of the mashed ball 18' illustrated in FIG. 5c. Although not illustrated in FIG. 5d, there will also be a slight increase in the lateral spread, i.e. diameter, of the stamped ball 18'.

By contrast, the present invention results in a completely different type of bonded connection, as will now be explained in the following description and accompanying drawings, singly and in combination.

In contrast with prior art ball bonding methods, one method, according to the present invention, does not simply stop the bonding process at this point (see FIG. 5b) and cut the wire 10 from the ball 18 (see FIGS. 5c and 5d), but rather continues to form a desired "contact profile", as will be described in more detail below.

FIG. 6a illustrates, in cross section, an example of a portion of the tip, i.e. the operative end, of a known capillary tool 12 that can be used in accordance with the present invention.

This capillary tool 12 comprises: a bore region 11; a small chamfer region 20; a tip region 24; and a sidewall region 26.

Typically, the chamfer region 20, which is illustrated as having a maximum diameter Cd, has an angle θ (Theta) of between 90° and 120°. In this particular embodiment, the angle θ equals 90°. The chamfer region 20 assists in the 'localisation' of the ball 18 during the bonding process and the 90° chamfer angle equalises the vertical and horizontal forces, respectively F2 and F1, applied to the ball 18.

The bore region 11, which is illustrated as having a diameter d2, typically has an outwardly flared region, which is situated some distance away from the chamfer region 20, that typically has an angle of 10°.

The tip region 24, which is illustrated as having a diameter Td, is typically 'slanted' in an upward direction away from the chamfer region 20. This slant is typically in the region of 8° and assists in the severing of a second bond in the case of 'wire bond' processes and methodologies. It should be noted that, according to the present invention, only one bond operation involving the capillary tool (12// 12') is required to form a pin, or pin-like, structure and as a result, this slanted tip region 24 could be 'designed out', i.e. removed, if required.

The sidewall region 26 is tapered, typically by 30°, in an outward direction from the tip region 24.

FIG. 6b illustrates, in cross section, a portion of the tip of the capillary illustrated in FIG. 6a in which is situated the associated wire and ball.

Referring to FIG. 6b, according to the present invention, a mass, i.e. a ball 18, of malleable material is formed, in accordance with the above description associated with FIGS. 1–4. However, in one of many possible methods associated with the present invention, the ball diameter Bd is preferably, although not necessarily, less than or equal to the chamfer diameter Cd, such that the ball 18 is recessed into the chamfer region 20, as illustrated. For reasons which shall be described below in relation to FIG. 6c, it is also preferable, in one embodiment of a method according to the present invention, that the difference in diameters of the bore 11 (d2) and the wire 10 (d1) is less than that which is typically associated with prior art embodiments, such as that described in connection with, and illustrated in, FIGS. 5a and 5b.

FIG. 6c illustrates, in cross section, a method, according to the present invention, of forming a 'profiled contact' by means of the capillary tool illustrated in FIG. 6b.

Referring to FIG. 6c, rather than stopping the ultrasonic vibration of the capillary tool 12 and disconnecting the wire 10, as per FIGS. 5b and 5c, the capillary tool 12 is allowed to continue to vibrate, preferably still under load, so as to promote the flow, i.e. 'extrusion', of ball material into the capillary tool 12, as illustrated.

Having disclosed a method, according to the present invention, of forming a pin, or pin-like, structure from a mass (18) of material, as per FIG. 6c, it will be appreciated by those skilled in the art that having a ball 18 of malleable material that has a diameter (Bd) that is less than or equal to the chamfer diameter (Cd), allows a substantial portion of the ball material to be situated, i.e. extruded, within the capillary tool 12. Or in other words, having a ball 18 of malleable material that has a diameter (Bd) that is less than or equal to the chamfer diameter (Cd), reduces the amount of ball material that is forced under the tip region 24 of the capillary tool 12, which, in accordance with the present invention, is advantageous.

It is an object of the present invention to maximise the amount of ball material, apart from that which actually forms the contact region 17, that is extruded into the capillary tool 12. Or in other words, it is an object of the present invention to minimise the amount of ball material that is trapped beneath the tip region 24.

As can been seen from FIG. 6c, the maximum mashed diameter of ball material that is trapped beneath the tip region 24, according to the present invention, is illustrated as the 'extruded diameter' Ed.

As illustrated in FIG. 6c, due to the 'exaggerated' differences in the diameters of the wire 10 and ball 18, respectively d1, and Bd, as described in relation to FIG. 6b, a 'thinned', or 'necked', i.e. a weakened, region 28 occurs between the wire 10 and the uppermost portion of the pin, or pin-like, structure.

Exaggerating the difference in the diameters of the wire 10 and/or ball 18 (due to its weight), serves as one way of pre-weakening the wire 10 prior to the disconnection of the wire 10 from the pin structure.

It will be appreciated by those skilled in the art that a series of experiments will need to be carried out on the bonding apparatus (not illustrated), in order to optimise for example: the length of wire to produce the required volume of ball material (Vball); ball diameter (Bd); extra 'extrusion' time; and/or required pin height etc. Such experimentation is well documented (and indeed encouraged) by the manufacturers of bonding apparatus and is common practise in state of the art bonding methodologies.

Figure 7:
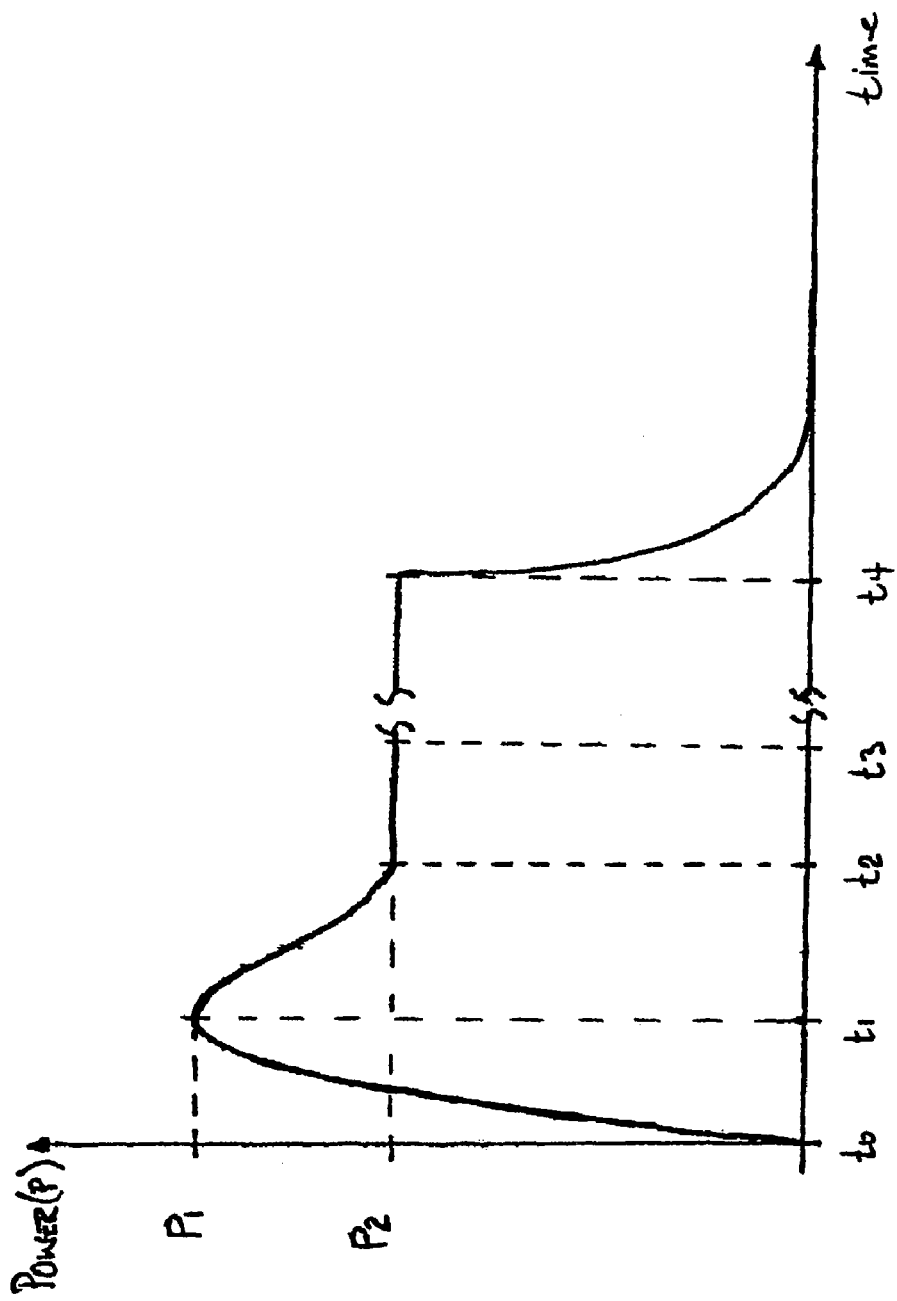
FIGS. 7 and 8 illustrate example power profiles, associated with a thermosonic bonding apparatus, that can be used in the formation of a pin, or pin-like, structure according to the present invention.

FIG. 7 illustrates a typical example of a measurable power profile used in a first method embodying the present invention.

Both prior art and the present invention bonding processes begin at time $t_0$, the point at which the ball 18 of FIGS. 4 and 6b is brought into contact with its associated bonding surface 16. At time $t_0$, power is applied to an actuator (not shown) associated with the bonding apparatus (not illustrated) which serves to vibrate the capillary tool 12, and hence the ball 18. Initially, the frictional force between the ball 18 and the surface 16 is low, which means the measured power at the capillary tool 12 rises to a maximum value $P_1$ due to resonance of the capillary tool 12. At time $t_1$, the frictional force between the ball 18 and the surface 16 has increased to such a level that the capillary tool 12 no longer resonates. This results in a fall in measured power to a second level $P_2$, at time $t_2$. The ball 18 and bonding surface 16 are then effectively 'bonded' to one another. However, due to variations in material properties, the power to the actuator is applied for a further time, until time $t_3$. In prior art methods, the power to the actuator is then switched off (at time $t_3$), and the measured power would decay. The reduction in power from $P_1$ to $P_2$ during the period $t_1$ to $t_3$ is commonly known and understood as 'lug down' by those skilled in the art. Typically, the period $t_0$ to $t_3$ is in the region of 6–10 mS and the values of $P_1$ is typically in the region of 30 to 150 mW, and $P_2$ is some 10% to 20% lower than $P_1$. At an appropriate time thereafter in the prior art bonding process, the wire 10 can be operatively disconnected from the ball 18 and the process repeats itself at the next bond surface location.

Figure 9:
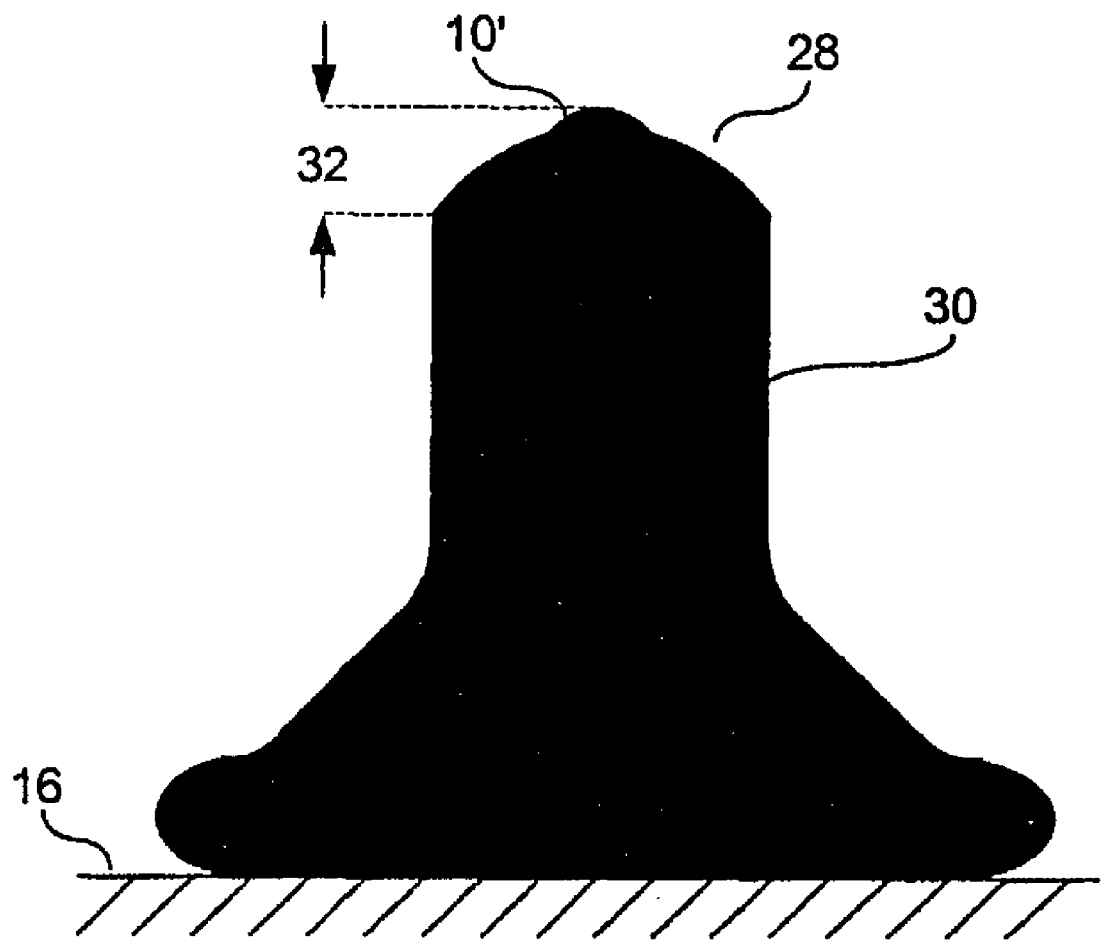
FIG. 9 illustrates an example of a pin, or pin-like, structure that is formed, according to the present invention, in association FIGS. 1–8.

According to one embodiment of the present invention, rather than cutting the power to the actuator at time $t_3$, the power is applied for an additional time until time $t_4$. In accordance with the present invention, the measured power, $P_2$, during this time ($t_4$-$t_3$) remains substantially constant, since the ball 18 is bonded to the surface 16. The effect of the ultrasonic power during time $t_3$ to $t_4$ is to render the material plastic, such that the ball is extruded up into the capillary tool 12. Typically, the period $t_3$ to $t_4$ can be in the region of tens of milliseconds, but this time ($t_4$-$t_3$) is naturally dependent upon a number of factors such as, for example, ball dimensions, ball material, power and the required pin height etc. At time $t_4$, the power to the actuator is cut, and the measured power decays to zero. Thereafter, the wire 10 can be disconnected from the resulting pin, or pin-like, structure and the process repeats itself at the next bond surface location. One example of the resulting pin structure is shown in FIG. 9, to be described in more detail below.

Figure 8:
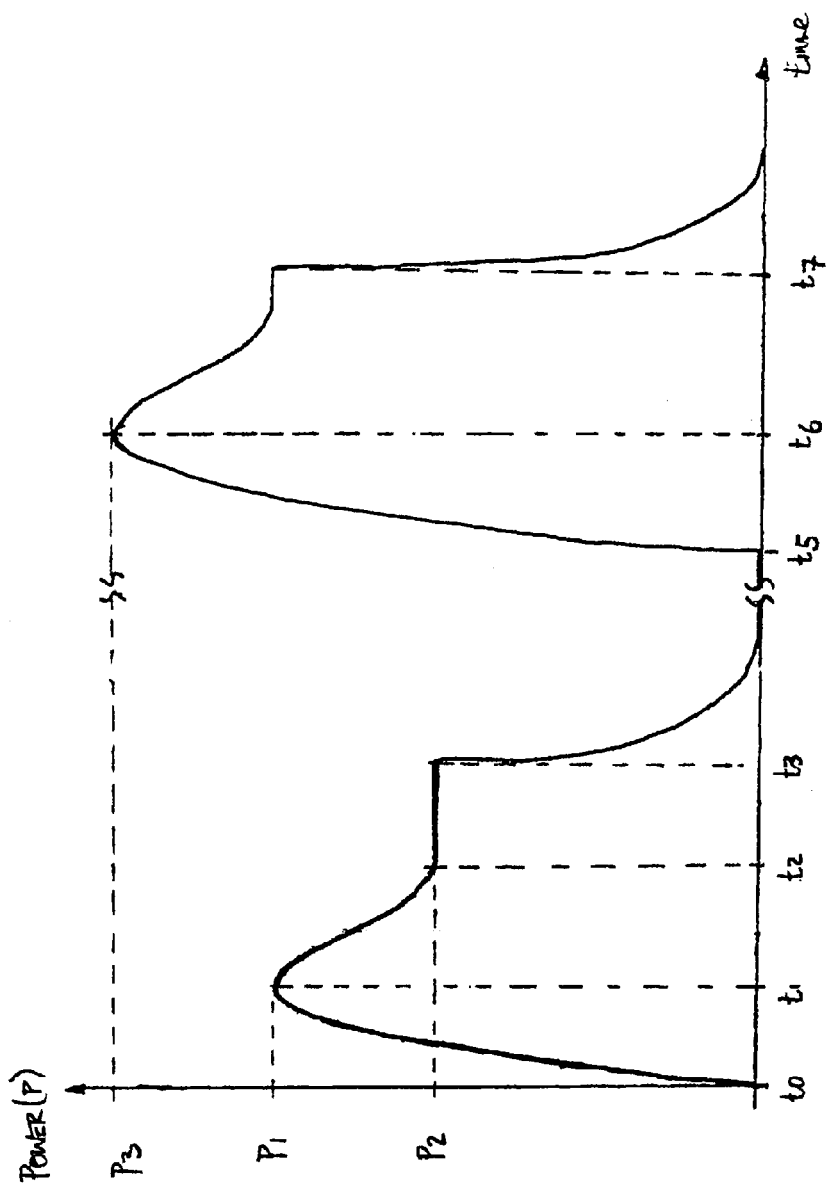

FIG. 8 illustrates another example of a measurable power profile used in a method embodying the present invention.

As will be appreciated, the power profile of FIG. 8 follows that illustrated in FIG. 7 until time $t_3$. In accordance with a method of the present invention, at time $t_3$ the applied power is cut and the measured power decays to zero, as in the prior art. However, in this embodiment of the invention, increased power is applied to the actuator at a time $t_5$ after the first power applications ($P_1/P_2$). This increased applied power results in a peak measured power $P_3$ at a time $t_6$ which acts upon the bonded ball 18.

Preferably, in addition to the increased power $P_3$, a greater load L' is applied to the ball 18, via the capillary tool 12, than in the previous case. By applying an increased load L' and increased ultrasonic power $P_3$ to the ball 18, the ball material is encouraged to extrude up into the capillary tool 12. The increased power $P_3$ serves to prevent the ball material sticking to the bore 11 of the capillary tool 12, and serves to test the strength of the bond between the ball material and the surface 16, as will be described below in more detail. The extruded material forms a pin or pin-like structure as will be described below.

As will be clear from FIG. 7, bonding occurs during the time period $t_0$ to $t_3$ (the "bonding period"). The bonding apparatus (not illustrated), and hence capillary tool 12, is then reset during the time period $t_3$ to $t_5$, which is typically 1–2 milliseconds and extrusion occurs during the time period $t_5$ to $t_7$ (the "extrusion period"). At the end of the extrusion period ($t_7$), the applied power is cut and the measured power decays to zero. Thereafter, the wire 10 can be disconnected from the pin, or pin-like, structure and the process can then be repeated at the next bond location.

It will be readily appreciated by those skilled in the art that the load (L/L') exerted by the capillary tool 12 on the ball 18, can be altered. Typically, during the bonding period, a load in the region of 30 to 60 g can be applied to the ball 18, and during the extrusion period, a load in the region of 80 to 100 g can be applied to the ball 18.

In the embodiment of the present invention described with reference to FIG. 8, the applied power, and hence the measured power level ($P_3$) during the extrusion period is greater than that used during the bonding period. Using a higher power level during the extrusion period than that used during the bonding period, allows a shear test to be carried out on the bond automatically during the extrusion period. Carrying out a shear test on each bond in this way, with minimum increased time used is clearly advantageous, as will be appreciated by those skilled in the art.

In another, unillustrated, method embodying the present invention, the load L and applied power P are increased from the level set at time $t_3$. Therefore, rather than the bonding apparatus being reset during the time period $t_3$ to $t_5$, the applied load and power are dynamically controlled so as to increase from time $t_3$. In such an embodiment, the extrusion period occurs sooner than in the previously described cases, which is advantageous. At the end of the extrusion period, the bonding apparatus, and therefore capillary tool 12, is reset, i.e. the applied power is cut, and thereafter, the wire 10 is disconnected from the pin, or pin-like, structure. The process can then be repeated at the next bond surface location.

It will be readily appreciated and understood by those skilled in the art that the process for determining the optimum parameters for forming a ball bond is essentially a matter of experiment. Such factors as adjusting: the downward load L on the ball; the applied power; the time of applying the power; and the background temperature, are among some of the many factors that have to be taken into consideration when forming such ball bonds. The exact parameters which optimise methods embodying the present invention can be found by experiment and testing.

FIG. 9 illustrates a cross sectional view of a resultant pin, or pin-like structure, formed, as per FIGS. 6b and 6c, using a method according to the present invention.

The pin 30, or pin-like, structure has, in this particular embodiment, been formed using a state of the art capillary tool 12 having a straight, or substantially straight, bore 11.

The resultant upper portion of the pin 30 has a diameter, which substantially equals the diameter $d_2$ of the bore 11 of the capillary tool 12. That is to say, the resultant diameter of the upper portion of the pin 30 is greater than the diameter $d_1$ of the wire 10 and less than the diameter Bd of the ball 18 from which it was formed. The height of the pin 30 is clearly dependant upon a number of factors such as, for example, the volume of ball material, Vball, and the overall dimensions of the capillary tool 12 cavity.

As can be seen from FIG. 9, due to the induced 'necking' and wire disconnect, as described in relation to FIG. 6c, the top, i.e. free end, of the pin 30 has attached thereto a transition region 32. Within this transition region 32, a relatively small portion 10' of the wire 10 (not illustrated), in the form of a 'nipple', is left at the uppermost extremity of the pin 30.

In certain circumstances, it may be preferable to somewhat exaggerate the height of the transition region 32 so as to allow for the ultimate connection of pins 30, as will be described in detail below, to uneven surfaces. The 'thinner' and hence more pliable nature of this transition region 32, in comparison to the body of the pin 30, will deform during, for example, thermocompression bonding and 'normalise' any co-planarity issues, provided of course they are within reason, or specifically taken into account by having for example pins $30_1$–$30_N$ of varying M heights: where N and M are integers greater than or at least equal to two.

Conversely, the tapered region 32 may be planarised using known techniques. One such technique, commonly referred to as 'wicking', involves, in the case of a pin(s) 30 formed from gold, dipping the free end of a pin(s) 30 in a bath of molten tin, which is known to dissolve gold, thereby leaving a 'flatter' region at the free end of the pin(s) 30.

The aspect ratio (height to base diameter ratio) of pins (30/36) manufactured according to a method embodying the present invention is preferably, although not necessarily, greater than or equal to 0.5.

FIG. 10 illustrates an embodiment of a capillary tool according to the present invention.

The capillary tool 12' illustrated in FIG. 10 is a modified version of the capillary tool 12 illustrated in FIG. 6a.

Rather than reduce the diameter Bd of the ball 18 to meet the original chamfer 20 dimensions and parameters for a given capillary tool 12, as described and illustrated in accordance with FIG. 6b, it is preferable, according to the present invention, to increase, for a given ball diameter Bd, at least the diameter Cd of the original chamfer region 20 so as to substantially meet the ball 18, or mass, dimensions (Bd).

Clearly increasing the diameter Cd of the original chamfer region 20, allows a ball 18 having a much larger volume (Vball') to be used. In addition to increasing the original chamfer diameter (Cd) to a new value Cd', it is also preferable to decrease the original angle θ, i.e. 90°, associated with the original chamfer region 20.

Although not illustrated, it is also possible to modify, i.e. decrease, the angle θ (90°) of the chamfer region 20 of the original capillary 12, without modifying the chamfer diameter Cd in order to produce pin, or pin-like structures, according to the present invention.

It will be appreciated by those skilled in the art that the resultant capillary tool 12' and new 'lower' cavity region 34, as illustrated in FIG. 10, should, for the purposes of the present invention, be distinguished from the original capillary tool 12 and chamfer region 20 illustrated in FIGS. 5 and 6.

For the purposes of clarity, brevity and distinction of the present invention, the new capillary tool 12' shall now have the new cavity region 34 defined as the 'primary extrusion region' or 'PER' and the remaining bore region 11 defined shall now be defined as the 'secondary extrusion region' or SER.

According to the present invention, it is preferable, although not necessary, that the angle θ' associated with the PER is, at most, 90°. When the angle θ' is less than 90°, the vertical force F1, acting of the ball 18, is less than the horizontal force F2 acting on the ball 18. Therefore, the increase in the horizontal force F2 actively promotes extrusion of the, 'contained' or 'restrained', ball material into the capillary tool 12', i.e. the PER and possibly the SER, which is desirable.

The capillary tool 12' illustrated in FIG. 10 effectively has an operatively tapered PER and a straight, or substantially straight, SER. The PER tapers from a maximum diameter Cd'/PERd down to a minimum diameter $d_2$/SERd.

It will be appreciated by those skilled in the art that this capillary tool 12' could have its SER operatively tapered by some appropriate angle and/or curvature. Furthermore, the PER, and/or indeed the SER, could have a series, i.e. two or more, of 'linear', or substantially linear, tapered regions and/or 'non-linear' regions, as will be illustrated and described in more detail below.

One advantage of having a tapered, whether linear or otherwise, PER (and/or SER) over a straight, or substantially straight extrusion region(s) is that the horizontal grip of the capillary tool on the resultant pin (36), or pin-like structure, will be greater and the load L/L' needed to extrude this pin

(36) will be less. Exerting less load on the resultant pin (36) results is less load being exerted on the bond surface 16, which is advantageous.

It should be noted that it is also preferable, in accordance with the present invention, that the ball diameter Bd is operatively less than the chamfer diameter Cd/Cd', whether it's a state of the art capillary tool 12 or a capillary tool 12' according to the present invention that is employed. Making the ball diameter Bd operatively less than the chamfer diameter Cd/Cd' further promotes the extrusion of the ball material into the capillary tool 12/12'.

Furthermore, it should be noted that it is, according to the spirit of the present invention, possible to form pin, or pin-like, structures where the ball diameter is greater than the capillary diameter and/or where the angle θ is greater than 90°: although these pin, or pin-like structures, may not have all the properties associated with pin, or pin-like, structures formed according to preferred methods according to the present invention, but will nevertheless still be useful for connecting carriers together within the spirit of the present invention.

Having described, in relation to FIG. 10, one preferred embodiment, according to the present invention, it will be appreciated by those skilled in the art that for a desired 'pin profile', calculations and experimentation will yield the optimum: bonding apparatus control settings; wire material; capillary tool; mass parameters and/or dimensions for given carriers, applications and operating environments.

Figure 11A:
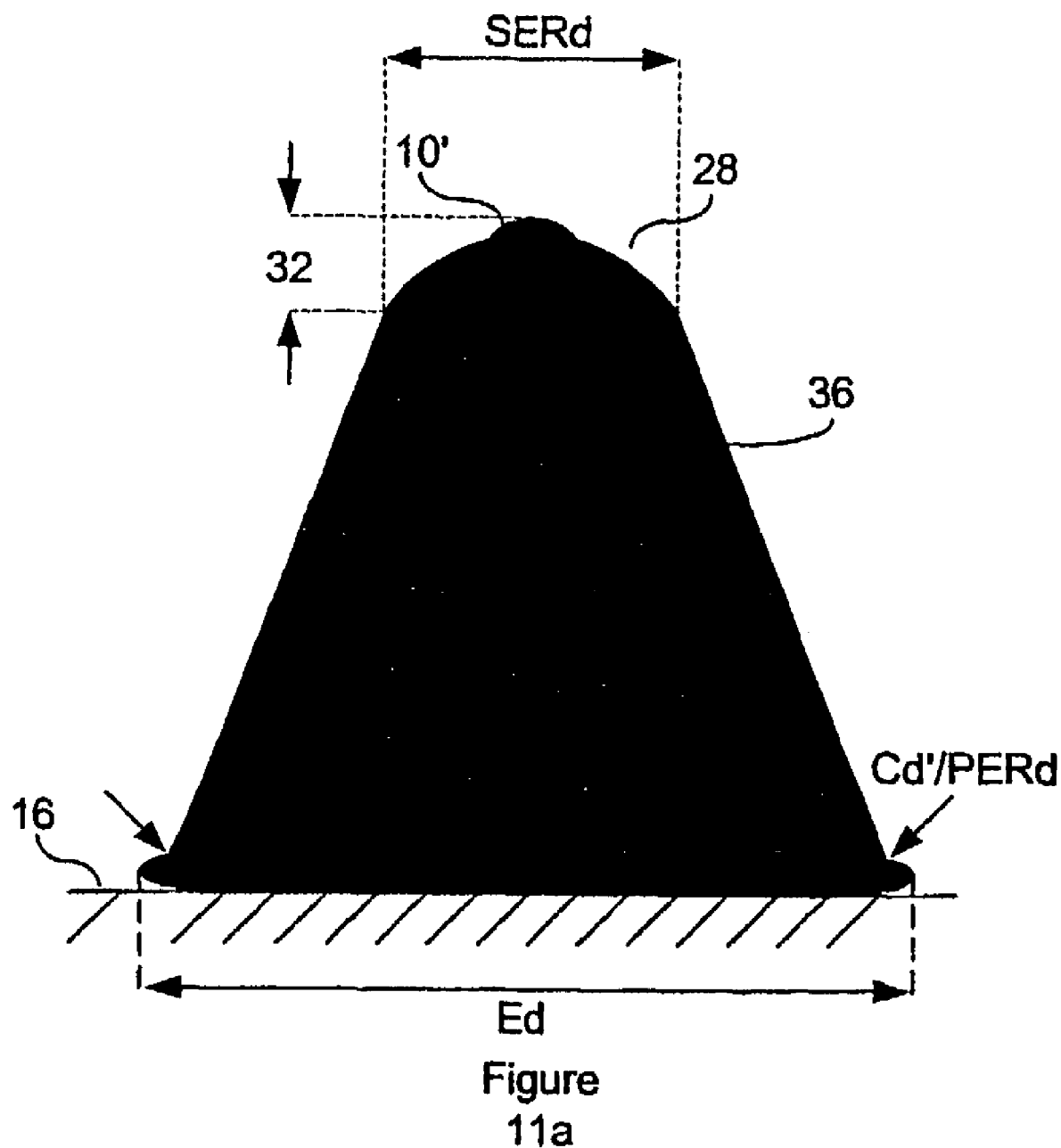
FIGS. 11a and 11b illustrate two, non-limiting, examples of possible pin, or pin-like, structures that are formed, according to the present invention, utilising the capillary tool illustrated in FIG. 10.
Figure 11B:
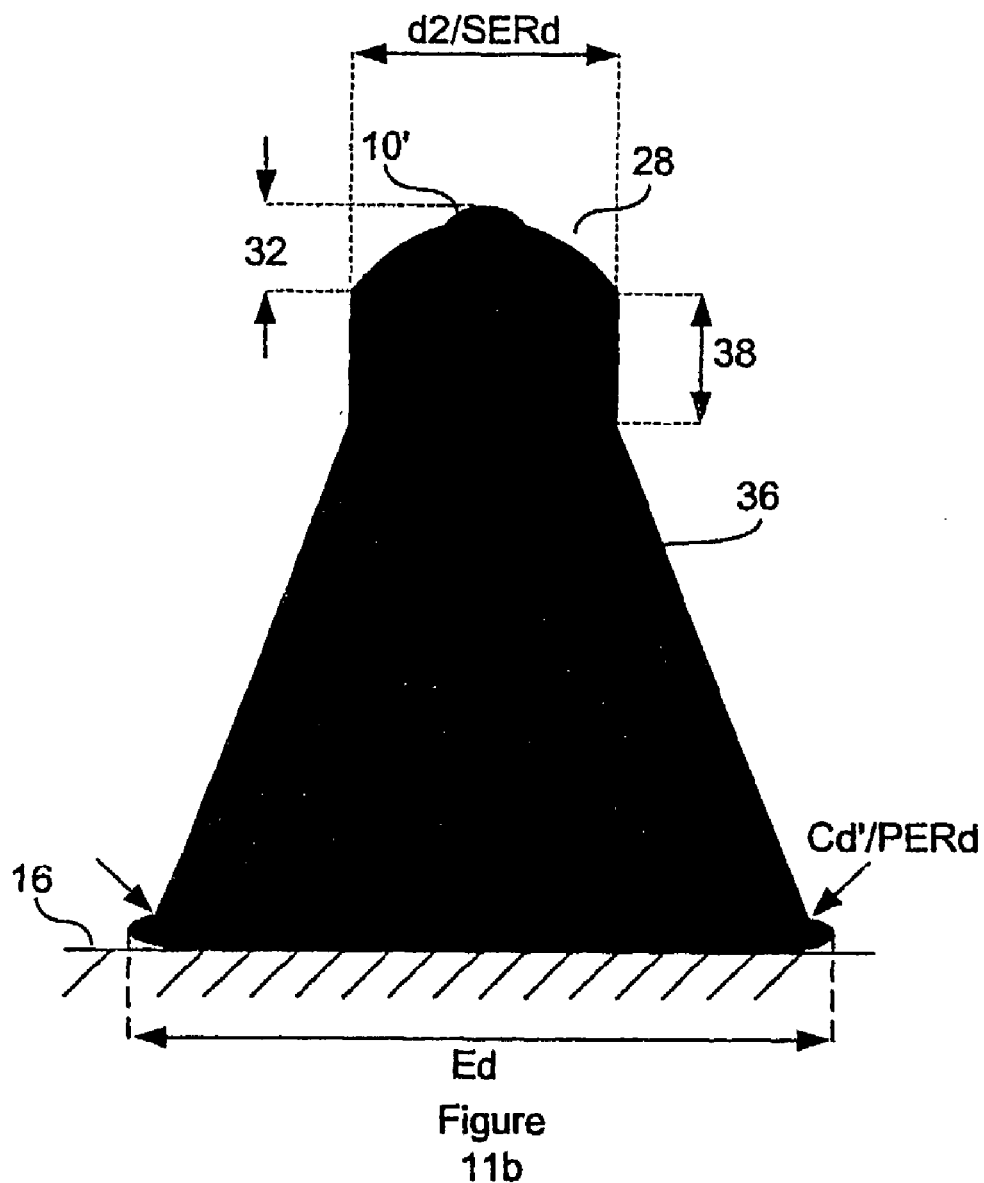

FIGS. 11a and 11b illustrate cross sectional views of resultant pins, or pin-like, structures that are formed in accordance with FIG. 10.

Referring to FIG. 11a, it can be seen that a substantial portion of the ball material has been forced, i.e. extruded, into the PER of the capillary tool 12' thereby forming a pin, or pin-like structure, 36 in accordance with the present invention.

In this particular illustration the pin structure 36 is shown as having a minimum diameter equal to the minimum diameter (SERd) of the PER, i.e. the maximum operative diameter (d2) of the SER. However, it should be noted that the minimum diameter of this pin 36 could be greater than the minimum diameter (SERd) of the PER (not illustrated), i.e. the pin 36 is shorter than that which is currently illustrated. Furthermore, it can be seen that, according to an object of the present invention, the extrusion diameter Ed (and hence associated volume of ball material) of the pin 36 is kept to a minimum.

The pin 36 illustrated in FIG. 11b is substantially similar to that illustrated in FIG. 11a, however, it does differ in that a portion (38) of the ball material has also been forced into SER, in addition to that which is within the PER.

Figure 12:
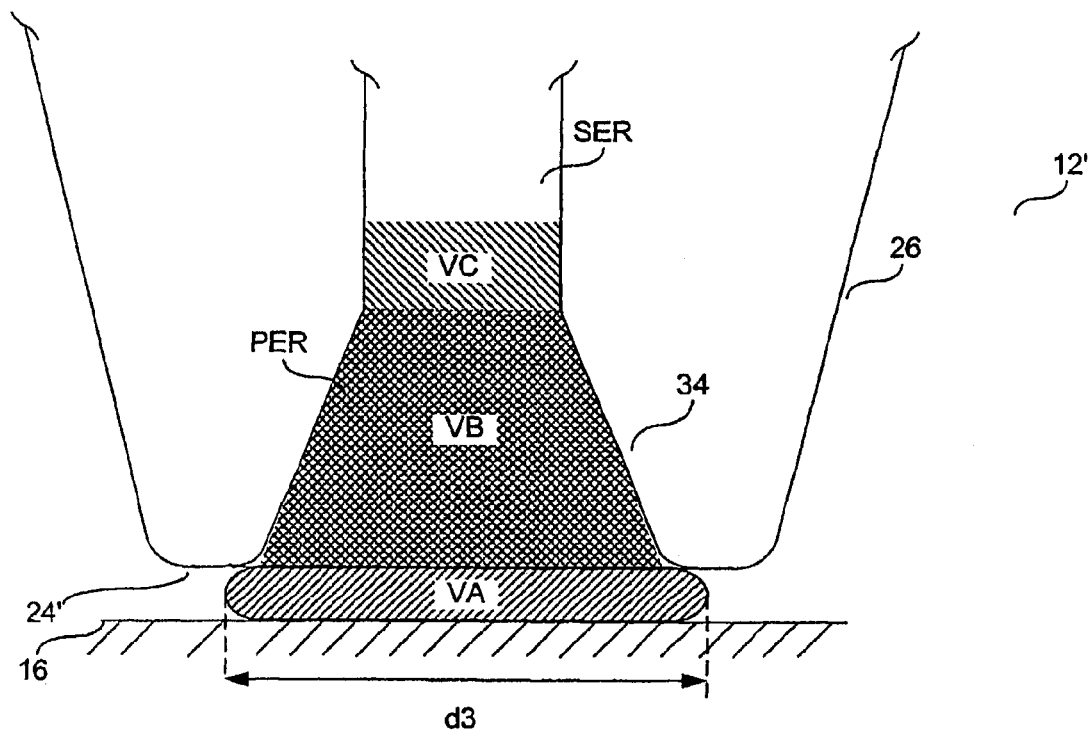
FIG. 12 illustrates the methodology of forming the two possible pin, or pin-like, structures illustrated in FIGS. 11a and 11b.

In accordance with the present invention, FIG. 12 illustrates the concept, according to the present invention, of extruding a mass of material into the capillary tool.

As can be seen in FIG. 12, an object of the present invention is to 'convert' a mass (Vball) of malleable material, initially situated at the mouth of the cavity of the capillary tool, into a pin, or pin-like, structure (36).

According to the present invention, it is preferable that said conversion results in said mass (Vball), having been operatively bonded to the bond surface 16, being: substantially extruded and contained within the PER or a portion thereof, wherein Vball substantially equals the volume (VB) of material within the PER; or substantial extruded and contained within the PER and a portion of the SER, wherein Vball substantially equals the volume (VB+VC) of material within the PER and a portion of the SER. It is an object of the present invention to minimise the volume (VA) of material outside of the PER and/or SER cavities, i.e. VB+VC should be greater, and preferably substantially greater, than VA. Furthermore, in the case where a portion (VA) of the mass (Vball) is located outside of the PER, the lateral spread (d3) should be kept to a minimum: such a scenario would also lead to finer bond pitches being achieved, as does the reduction of the diameter Td of the capillary tip region (24/24'/24"), both of which are advantageous and desirable.

FIGS. 13a–13h illustrated some examples of modified state of the art capillaries that may be produced and used in accordance with the present invention.

Figure 13A:
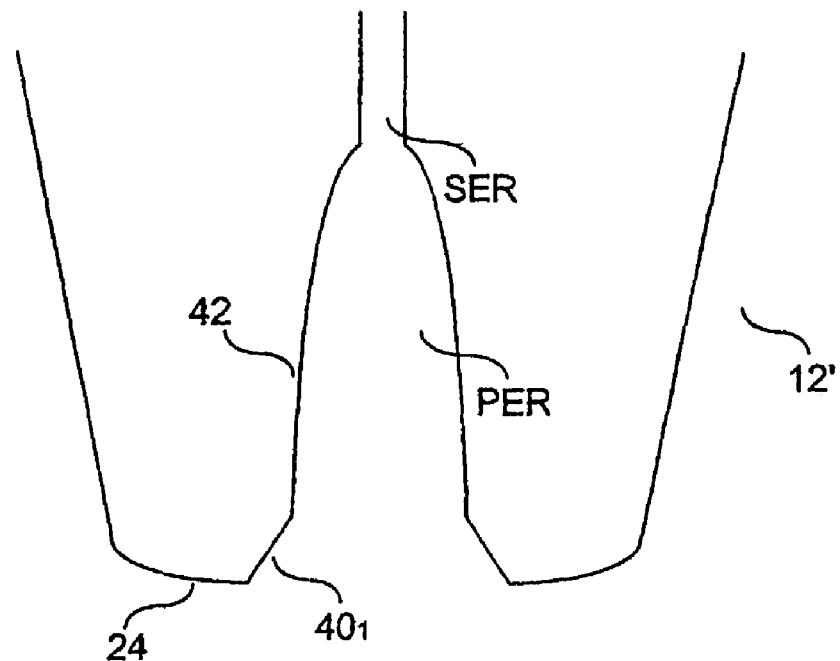

FIG. 13a illustrates a capillary tool 12' that has: a, tapered, tip region 24; a first, monotonic linearly tapering, portion $40_1$ to the PER; a second, monotonic tapering, curved portion 42 to the PER; and a straight, or substantially straight, SER.

Figure 13B:
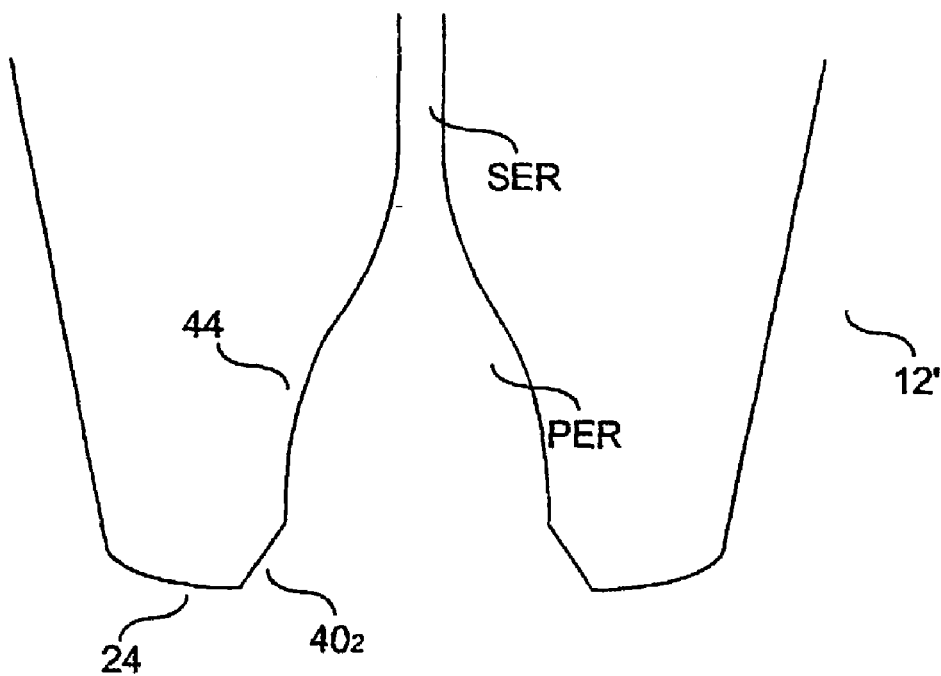

FIG. 13b illustrates a capillary tool 12' that has: a, tapered, tip region 24; a first, monotonic linearly tapering, portion $40_2$ to the PER; a second, monotonic tapering, curved portion 44 to the PER; and a straight, or substantially straight, SER.

Figure 13C:
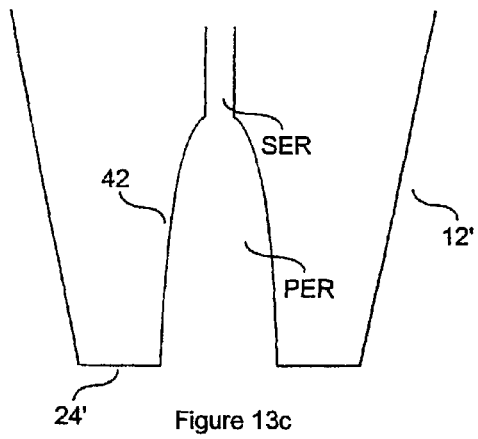

FIG. 13c illustrates a capillary tool 12' that has: a, horizontal, or substantially horizontal, tip region 24'; a first, monotonic tapering, curve portion 42 to the PER; and a straight, or substantially straight, SER.

Figure 13D:
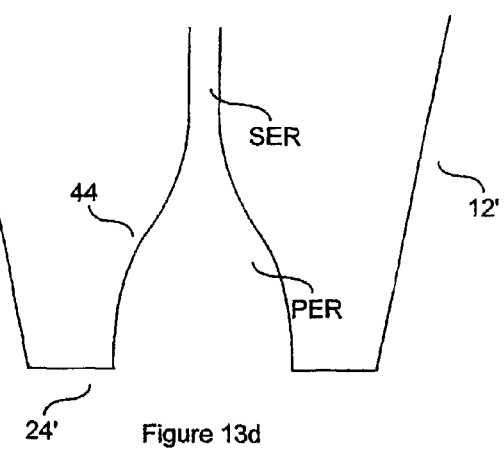

FIG. 13d illustrates a capillary tool 12' that has: a, horizontal, or substantially horizontal, tip region 24'; a first, monotonic tapering, curved portion 44 to the PER; and a straight, or substantially straight, SER.

Figure 13E:
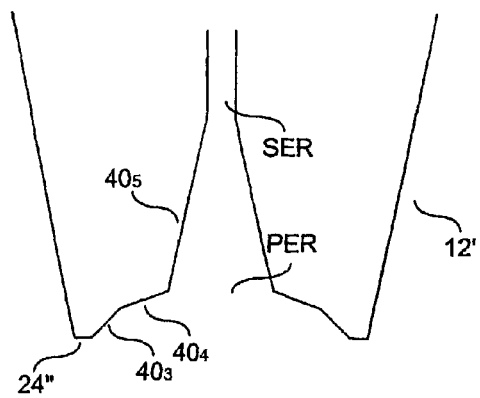

FIG. 13e illustrates a capillary tool 12' that has: a, horizontal, or substantially horizontal, tip region 24"; first, second and third, monotonic linearly tapering, portions, respectively $40_3$, $40_4$ and $40_5$, to the PER; and a straight, or substantially straight, SER.

Figure 13F:
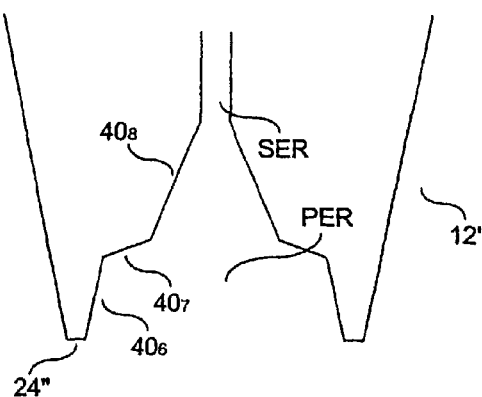

FIG. 13f illustrates a capillary tool 12' that has: a, horizontal, or substantially horizontal, tip region 24"; first, second and third, monotonic linearly tapering, portions, respectively $40_6$, $40_7$ and $40_8$ to the PER; and a straight, or substantially straight, SER.

FIG. 13g illustrates a capillary tool 12' that has: a, horizontal, or substantially horizontal, tip region 24"; a series of, monotonic tapering, curved portions 46, to the PER; and a straight, or substantially straight, SER.

FIG. 13h illustrates a capillary tool 12' that has: a, horizontal, or substantially horizontal, tip region 24"; a, monotonic tapering, curved portion 48, to the PER; first and second, monotonic linearly tapering, portions, respectively $40_9$ and $40_{10}$, to the PER; and a straight, or substantially straight, SER.

The above FIGS. 13a–13h, are intended as non-limiting examples of changes that can be made to a capillary tool in accordance with the present invention. It will be appreciated by those skilled in the art that, having disclosed said examples in FIGS. 13a–13h, there are an infinite number of possibilities regarding the operative modifications, of, for example, angles, dimensions and the like, that can generally be carried out to a capillary tool which determine the form and dimensions of a pin, or pin-like structure that are within the spirit of the present invention.

It will be appreciated by those skilled in the art that a capillary tool (12/12') can be made from a number of different materials, including, but not limited to: ceramic; precious and semi-precious stones such as ruby, zerconia composite; and metal, such as tungsten. Furthermore, it will be appreciated by those skilled in the art that it is possible to 'profile' a capillary tool bore in a number of different ways such as, for example, mechanical drilling, laser drilling, die casting, ceramic injection molding (CIM) etc. Furthermore, it is also possible to 'profile' a capillary tool cavity in such a way so that the producer, or the origin, of a pin 36 may be identified. Such a profiling technique being analogous to 'fingerprinting' or 'watermarking'.

A feature of the present invention is that the capillary tool cavity preferably has the required dimensions and/or profile so as to form a pin 36, or pin-like, structure having the required mechanical characteristics for its intended application. The dimensions, profile, materials, tools, apparatus etc that are employed in the formation of a pin 36, or pin-like, structure will, to a greater or lesser extent, be determined by the likely stresses, which would normally be expected to be transferred between the two carriers. It is likely that a material, which is malleable at normal operating temperatures, would be used for the pins 36 so that differences in thermal expansion between two carriers can be compensated for, i.e. counteracted, by the deformation of the pins 36. Such deformation of the pins 36 reduces, or eliminates, the transferred stresses between two carriers.

The material from which the pin 36 is formed is preferably a malleable conductive material. Some non-limiting examples of such malleable conductive materials include aluminium, gold or copper, including alloys thereof.

It will be appreciated by those skilled in the art that the capillary tool cavity and resultant pin can either be scaled up or down, depending upon the application and/or materials used either to form the pin 36.

So far, the invention has been described only as regards embodiments in which a mass (18) of malleable material is formed by a wire 10 as part of an overall combined bonding/extruding process. However, one skilled in the art will appreciate that the extrusion step is not dependent on any one particular method of providing the ball 18, or mass, of malleable material in the first instance. The extrusion step is indeed applicable to any ball, stud or similar mass of material provided on a bonding surface 16, irrespective of whether or not the extrusion step follows rapidly or continuously after the bonding step or whether there is a gap of undefined duration between the bonding and extrusion steps.

For example, a stud, ball or similar mass of malleable material can be provided on the bonding surface 16 by any known technique, ultrasonic scrubbing being but one option. The mass can be of undefined shape, provided that there is a sufficient portion that can be operative engaged by the capillary tool 12/12'. The application of a combined load (L/L') and ultrasonic power of predetermined magnitude and duration to such a mass will lead to the mass becoming plastic and extruding at least partially into the cavity of the capillary tool 12/12', as in previous embodiments. The operating conditions can be the same as those outlined for the embodiment(s) using a wire 10 as the source of the mass (18). Alternatively, other operating conditions may need to be established, depending on the materials involved. Establishing those conditions would be well within the skills of the average practitioner and would involve no undue experimentation.

Figure 14:
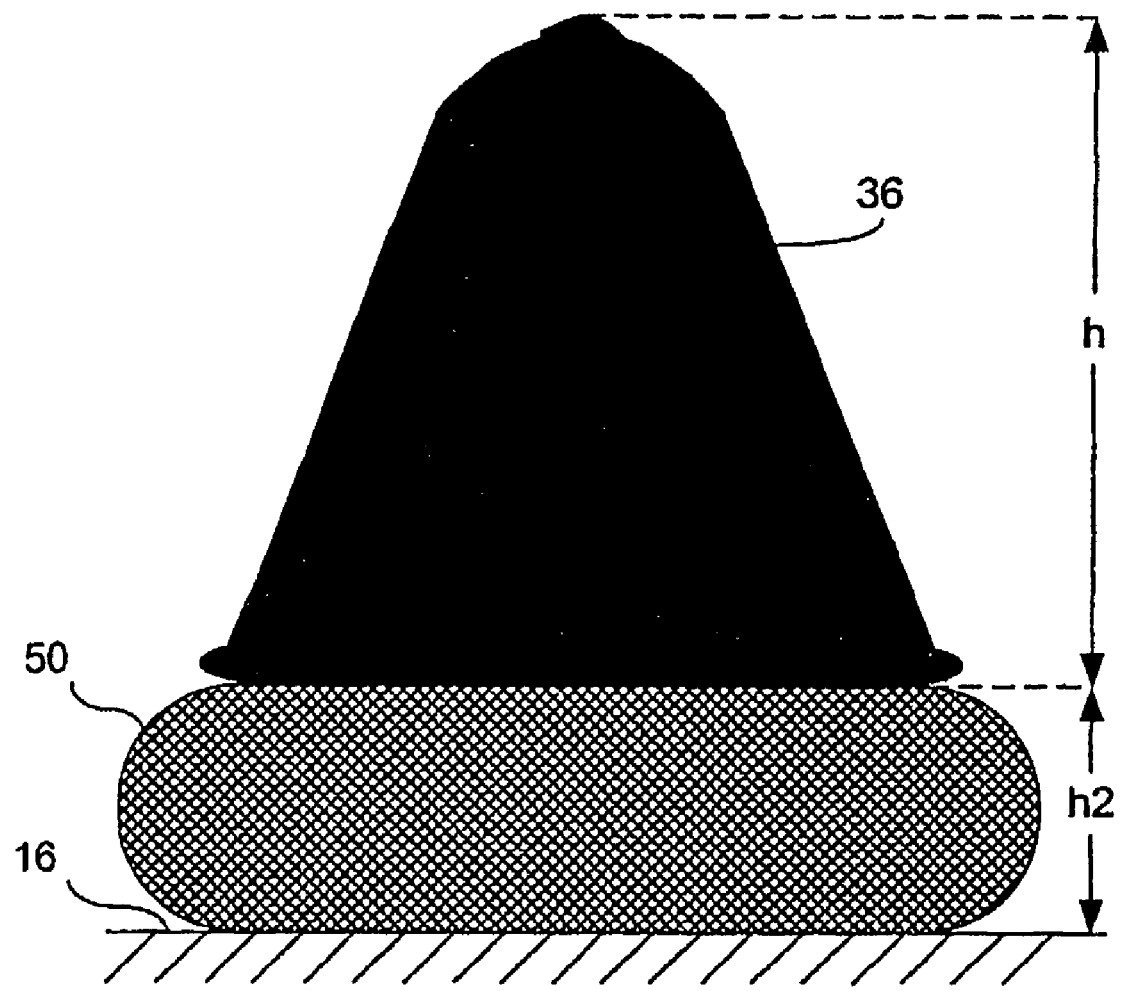
FIG. 14 illustrates an alternative embodiment of a pin, or pin-like, structure according to the present invention, that has been connected on the top of a pre-existing bond or connection.

FIG. 14 illustrates an alternative embodiment of a pin, or pin-like, structure according to the present invention.

FIG. 14 is essentially the same as that illustrated in FIG. 11a. However, FIG. 14 differs from FIG. 11a in that the pin 36 is connected, at its base, on the top of a pre-existing bond or connection 50. Such a pre-existing bond or connection 50 could, for example, be a 'stud' or 'ball' bond. Alternatively, although not illustrated, the top, i.e. the free end, of a connected pin 36 could be attached to a pre-existing bond 50, or indeed both ends of the pin 36 could be connected to pre-existing bonds or connections, regardless of whether or not they are of the same, or similar, type.

One advantage of the embodiment illustrated in FIG. 14 is that there is an increased height (h+h2) from the top of the bond surface 16 to the top of the pin 36.

One example application, according to the present invention, of a pin 36 is that a plurality pins ($36_1$–$36_N$: where N is an integer greater than or at least equal to two) are bonded to a semiconductor device, such as, for example, a silicon based semiconductor device. It will be appreciated by those skilled in the art that the pins ($36_1$–$36_N$) could also be bonded to other semiconductor devices such as GaAS or SiGe based semiconductor devices for example. The semiconductor device can then be mounted on a suitable carrier by operatively connecting the free ends of the pins $36_1$–$36_N$ to the carrier.

Figure 15A:
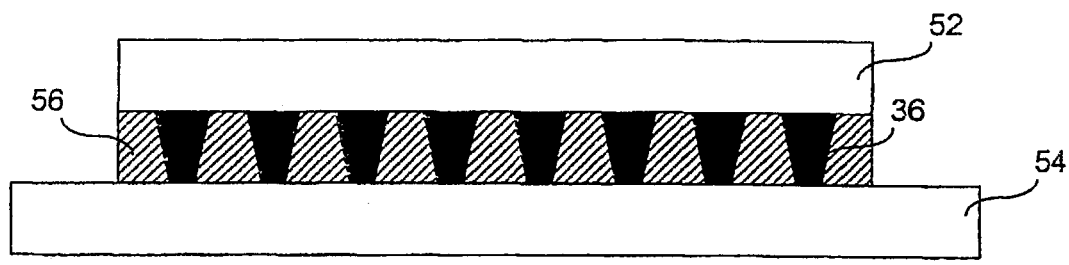
FIGS. 15a–15d illustrate, non-limiting, examples, according to the present invention, of connections being made to two or more electronic carriers.

FIG. 15a illustrates the attachment of a first carrier, for example a semiconductor device 52, to a second carrier 54, a ceramic interposer for example, the first carrier 52 having a plurality of pins 36 bonded thereto. Also illustrated in FIG. 15a is an underfill material 56, which is typically a thermoset plastic, that is introduced into the gap, produced by the pins 36 between the two carriers 52, 54. One advantage of introducing an underfill material 56, as illustrated, is that it enhances the stress relieving and connection properties associated with the pins 36. Another advantage associated with the underfill 56 is that it prevents fluid ingress between the two carriers 52, 54. It will be appreciated by those skilled in the art that this example embodiment illustrates, according to the present invention, a basic 'chip size package'. Furthermore, it will be apparent to those skilled in the art that further enhancements can be made to the embodiment of this figure. Such enhancements include, but are not limited to, the attachment of a suitable heatspreader or heatsink and/or the complete encapsulation, for protective purposes, of the top surface and sidewalls of the first carrier 52, including the underfill material 56: such encapsulation being achieved by the use of a suitable thermoset epoxy/plastic, thermoplastic or glue for example.

Figure 15B:
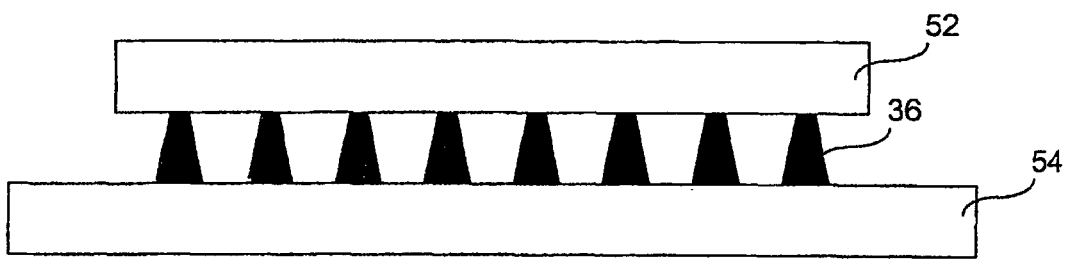

FIG. 15b illustrates the attachment of first and second carriers, respectively 52 and 54, as illustrated in FIG. 15a. However, FIG. 15b differs from FIG. 15a in that: the underfill material 56 has not been illustrated for reasons of brevity; and the pins 36 have first been bonded, according to the present invention, to the second carrier 54.

Figure 15C:
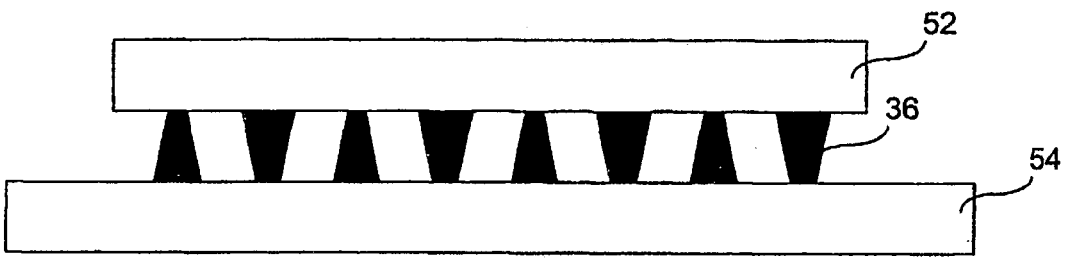

FIG. 15c illustrates a combination of the bonding techniques that are illustrated in FIGS. 15a and 15b. Therefore, FIG. 15c illustrates an example of pin 36 connections that have first been bonded in an alternate manner to the two separate carriers 52, 54 prior to the carriers being connected together.

Figure 15D:
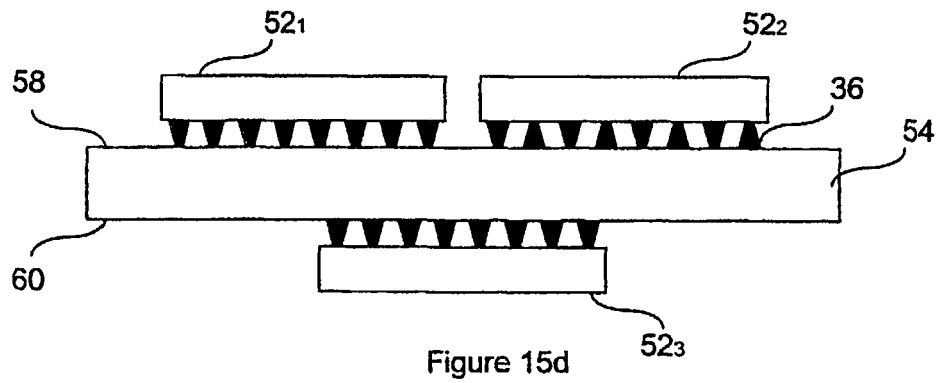

FIG. 15d illustrates a non-limiting example of a combination of the bonding techniques illustrated in FIGS. 15a to 15c. It should be noted that in this illustration, a plurality of first carrier types $52_1$–$52_3$ are connected to both the top 58 and bottom 60 surfaces of the second carrier 54. It will be appreciated by those skilled in the art that the arrangement in FIG. 15d constitutes a basic multi-chip-module having connections 36 according to the present invention.

Although not illustrated in FIGS. 15a–15d, the second carrier 54 could have a series of connections, such as pins 36, for connecting the second carrier to a third carrier and so on. Furthermore, it should be noted that, although not illustrated, the second carrier 54 will typically have a series of interconnections both upon, and possibly within, its structure that extend to the system or apparatus in which it is situated.

Figure 16:
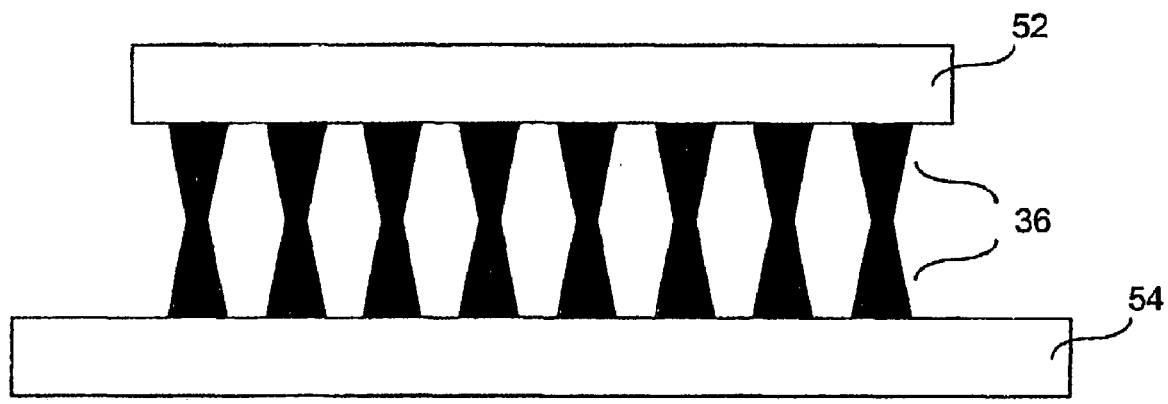
FIG. 16 illustrates an example, according to the present invention, of one method increasing the stand-off height between two electronic carriers.

As illustrated in FIG. 16, it is also possible to form aligned pins 36 on separate first and second carriers 52, 54 and then operatively connect the aligned pins 36 together. An advantage of such a technique is that greater mechanical stresses can be compensated for since the overall pin height between the carriers is larger than with single pins.

Figure 17:
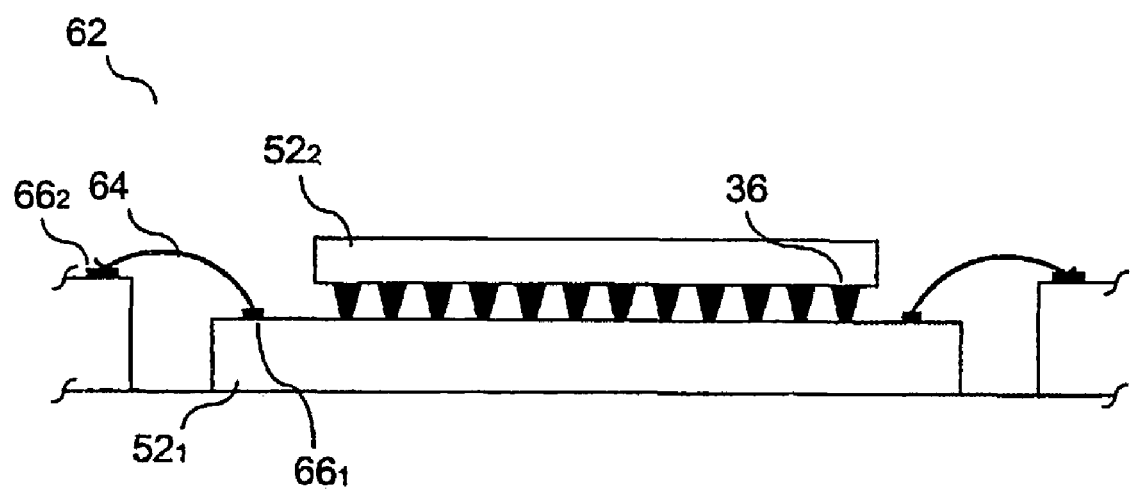
FIG. 17 illustrates a cross sectional view of an IC package containing a plurality of IC's that are connected together in accordance with the present invention.

FIG. 17 illustrates a cross sectional view of an IC package containing a plurality of IC's.

The IC package 62 has: a first IC $52_1$ that has conventional wire bonds 64 that are bonded to bond pads $66_1$, $66_2$, for example, that are respectively associated with the first IC $52_1$ and the IC package 62; and a second IC $52_2$ that is operatively connected, according to the present invention, to the first IC $52_1$. The arrangement of these first and second IC's $52_1$, $52_2$ represents a 'stacked IC', i.e. a 3D, type arrangement.

The second IC $52_2$ is operatively connected, according to the present invention, by pins 36 to the first IC $52_1$. These pins 36 may, for example, be placed around the periphery of the second IC $52_2$ or alternatively they may be set out in some form of area array. It will be appreciated by those skilled in the art that if the first and second IC's $52_1$, $52_2$ are both manufactured from the same materials then there is no real issue with respect to matching the CTE's of these two IC's. However, in a situation where there is no CTE mismatch to be compensated, the pins 36 have the added advantage in that: (i) they can be placed over the entire active surface of the second IC $52_2$, and therefore the corresponding active surface, for example, of the first IC $52_1$; and (ii) they can have a pitch between them that is less than is achievable through, for example, ball or stud bonding techniques. This pitch improvement results in more connections per unit area if pins 36 are used as opposed to balls, studs or the like. Such a scenario is clearly very advantageous. One possible application, amongst many, of the arrangement shown in this figure is one where the first IC $52_1$ is an IC that includes a processing device, i.e. an ALU, and the second IC $52_2$ includes memory, such as DRAM, SRAM etc. The advantages of 'piggy backing', or 'stacking', a memory device ($52_2$), that would normally be referred to as 'external memory', i.e. external, relative to the processing device ($52_1$), is that the connection distance between the two IC's is small and the density of connections high, which is desirable and advantageous.

Figure 18:
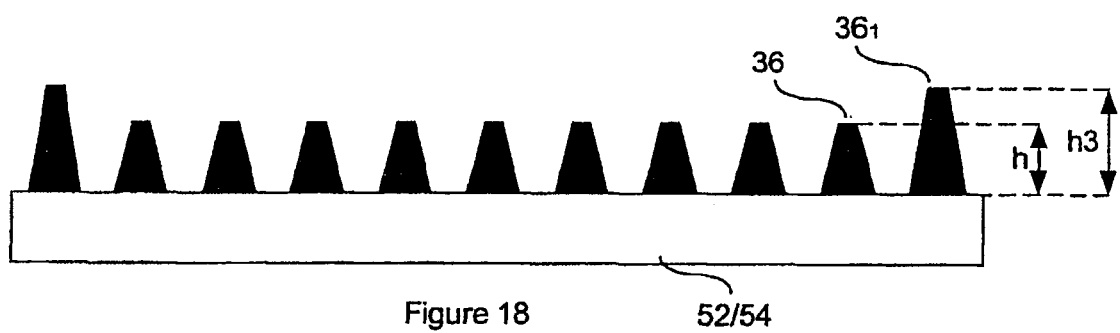
FIG. 18 illustrates a, non-limiting, example, according to the present invention, of an electronic carrier that has a plurality of pins that have different heights.

FIG. 18 illustrates an example, according to the present invention, of a carrier that has a plurality of pins that have different heights.

Regarding a first carrier 52/54, a first plurality of pins 36 are illustrated as having a first height h and the second plurality of pins $36_1$ are illustrated as having a second height h3: the second height h3 being greater than the first height h. Clearly, a second carrier (54/52), not illustrated, to which the free ends of the pins 36, $36_1$ are to be connected must be operatively arranged such that it can receive such different size pins 36, $36_1$.

The concept illustrated in this figure can be broadened such that there are three or more pins, or sets of pins, that have three of more different heights.

Figure 19:
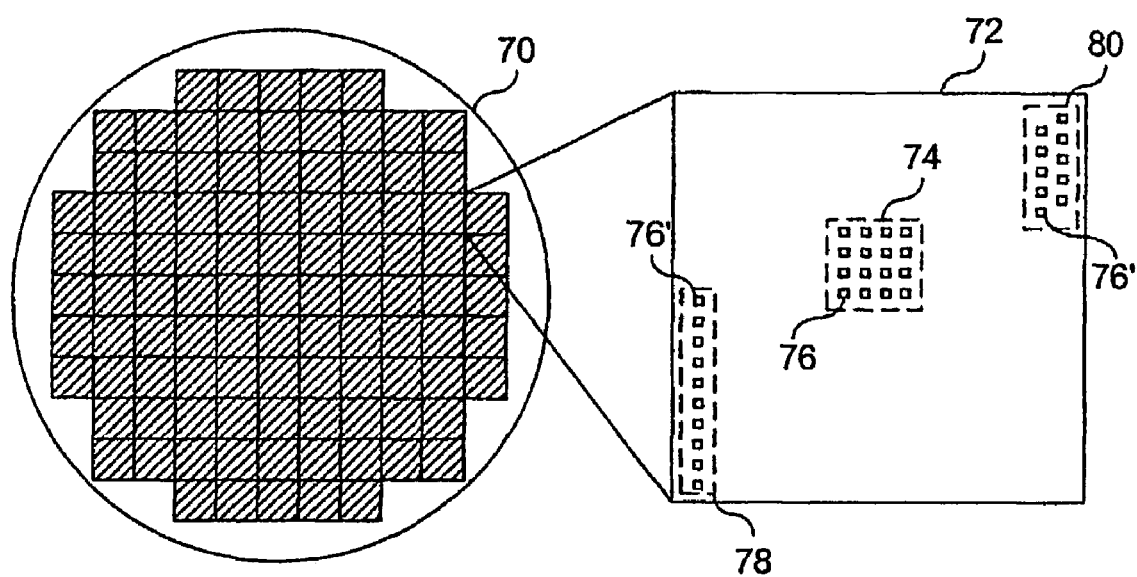
FIG. 19 illustrates an embodiment of a semiconductor wafer having a variety of example bond pads to which, according to the present invention, pin, or pin-like, structures may be connected.

FIG. 19 illustrates an embodiment of a semiconductor wafer.

The wafer 70 comprises a plurality of IC's 72, i.e. die, which in turn comprise a plurality of bond pads which are illustrated as being arranged in a variety of different ways.

It should be noted that there exist two main categories for the positioning of bond pads on an IC: (i) "peripheral" bond pads and; (ii) "non-peripheral" bond pads. "Peripheral" bond pads are bond pads that are situated about the peripheral of an IC, whereas "non-peripheral" bond pads are situated on the IC other than at the peripheral. It will be appreciated by those skilled in the art that, according to the present invention, pins, or pin-like, structures can be bonded to either peripheral and/or non-peripheral bond pads, including combinations thereof. Furthermore, it will be appreciated by those skilled in the art that it is often advantageous, for reasons including: IC design; functionality; and performance; to use non-peripheral bond pads, as will be described below.

The bond pads may be arranged, for example, as: an area array 74 of non-peripheral bond pads 76; a peripheral, single strip 78 of bond pads 76'; a peripheral, "staggered" dual (triple or quadruple) strip 80 of bond pads 76'; or any combination thereof. It is well understood by those skilled in the art that there are differences associated with the design of peripheral bond pads 76' and non-peripheral 76 bond pads. Furthermore, it will be appreciated by those skilled in the art that, according to the present invention, the bond pads 76, 76' can be arranged in any manner that a IC/system designer may want, provided of course that they meet all necessary design rule criteria.

It will be appreciated by those skilled in the art that the introduction of any advantageous 'wafer level' process step in addition to known wafer level processing steps is extremely advantageous. Therefore, according to one aspect of the present invention, an additional wafer level step that involves the 'pinning' of at least one die 72, i.e. IC, of a wafer 70, but preferably, at least, all 'known good die', can be readily achieved. This additional 'pinning step' may be carried out at any appropriate point in a wafer level processing methodology. However, it is preferable, according to the present invention that the wafer level pinning is carried out either after the wafer 70 has been 'probed' and tested in some manner or that the pins 36 are bonded to the wafer 70 prior to the pins 36 being utilised as the connection means for carrying out wafer level testing. In the case where the pins 36 are bonded to a wafer prior to any testing, it should now be appreciated by those skilled in the art that it will be feasible to 'test' each of the die 72 of the wafer 70 serially or preferable simultaneously, which is desirable and advantageous. The tests that may be carried out upon pinned singularised die 72 or wafers 70 could be a lot more comprehensive that would normally be achieved, which is again desirable and advantageous, as will be appreciated by those skilled in the art.

Although not illustrated, having a pinned wafer 70 will allow for 'burn-in' to be carried out upon all wafer die 72 with the appropriate burn-in carrier. Furthermore, accelerated burn-in could be carried out. The present invention allows for higher temperatures to be achieved, for example 250° C., during burn-in than can, normally, currently be achieved, i.e. typically 125° C., as there are no 'package' materials (epoxies, plastics etc.) to take into consideration when elevating the burn-in temperature. Being able to: (a) elevate the burn-in temperature; and/or (b) burn-in an entire wafer 70, is very advantageous for reasons that will, in light of the foregoing disclosure, be appreciated by those skilled in the art.

It will be appreciated by those skilled in the art that the present invention is applicable to many different known package types, systems and connection methodologies such as, for example:

Hi-Reliability (HR)/Military IC packaging;
Lead Frame IC packaging;
Plastic, Ceramic or Organic Ball Grid Array IC packaging;
Chip Scale or Size (CSP) IC packaging;
Direct Chip Attach (DCA) IC packaging; and
Multi-Chip-Module (MCM) IC packaging.

Furthermore such package types, systems and connection methodologies are applicable to: Commercial/Industrial; Automotive; and/or HR/Military working environments.

Having disclosed some descriptive and illustrative non-limiting examples in connection with the present invention, many further non-described/illustrated aspects will readily be appreciated by those skilled in the art, such as, for example: ball of material formed on the end of the wire can be of any suitable shape, the most common existing example shape is a sphere or near-spherical shape, but other alternative shapes could be used. The one requirement is that the ball is an enlarged mass of material on the end of the wire that is able to be extruded into the required contact profile shape. It will also be readily appreciated that the term "wire" can be construed to include filamentary material having any desired cross-section: although most usual wires have circular cross-sections, methods embodying the present invention can be carried out using wires having any desired cross-section.

Furthermore, it will be appreciated by those skilled in that art that the principals disclosed in connection with the present invention have the potential to lead to, for example, many desirable and advantageous new and better methodologies of: processing and/or testing wafers and/or IC's; designing IC's, systems and apparatus; reducing IC, system and apparatus sizes and costs; and reducing materials usage and/or wastage etc.

The invention claimed is:

1. A method of forming a connection on a surface of an electronic carrier, the method comprising:
   providing a malleable wire having a first diameter via a bore of a capillary tool, the bore defining a main portion having a second diameter greater than the first diameter and defining a location portion, the location portion extending and increasing in diameter from the main portion to an end of the tool, the location portion having a third diameter, greater than the second diameter, at the end of the tool;
   forming a ball of material on an end of the wire, the ball of material having an initial diameter less than, or equal to, the third diameter;
   bonding the ball of material to a bonding surface of an electronic carrier to form a connection having a fourth diameter;
   extruding the ball of material through the second diameter of the main portion of the bore of the capillary tool to form a pin structures, having a diameter greater than the first diameter and less than the fourth diameter, and a weakened region between the wire and a tip of the pin structure, a majority of the ball of material being extruded through the second diameter of the main portion of the bore to form the pin structure; and
   disconnecting the wire from the tip of the pin structure at the weakened region.

2. A method as claimed in claim 1, wherein the step of bonding the ball of material to the bonding surface includes:
   holding the ball of material in contact with the bonding surface using a predetermined load; and
   applying a first predetermined level of ultrasonic power to the ball of the material, for a first predetermined time period.

3. A method as claimed in claim 2, wherein the step of extruding the ball of material into the bore includes:
   continuing to apply the first predetermined level of ultrasonic power to the ball of material for an additional second predetermined time period.

4. A method as claimed in claim 2, wherein the step of extruding the ball of material into the bore includes:
   applying a second predetermined level of ultrasonic power to the ball of material for a third predetermined time period subsequent to the first predetermined time period.

5. A method as claimed in claim 1, wherein the main portion of the bore has a substantially constant diameter along its length.

6. A method as claimed in claim 1, wherein the main portion of the bore is tapered such that its diameter reduces from an initial diameter to the second diameter, along the length of the bore.

7. A method as claimed in claim 1, wherein the pin structure is of a height greater than, or equal to, the fourth diameter.

8. A method as claimed in claim 1, wherein the wire is of a malleable conductive material.

9. A method as claimed in claim 8, wherein the malleable conductive material is gold.

10. A method as claimed in claim 8, wherein the malleable conductive material is a gold alloy.

11. A method as claimed in claim 8, wherein the malleable conductive material is copper.

12. A method as claimed in claim 8, wherein the malleable conductive material is a copper alloy.

13. A method as claimed in claim 1, wherein the carrier is an integrated circuit.

14. A method as claimed in claim 1, wherein the carrier is an electronic interposer.

15. A method as claimed in claim 1, wherein the carrier is a ceramic interposer.

16. A method as claimed in claim 1, wherein the carrier is a printed circuit board.

17. A method as claimed in claim 1, wherein the carrier is an organic electronic carrier.

18. A method as claimed in claim 1, wherein the pin structure has a diameter substantially equal to the second diameter after said step of extruding the ball of material into the bore.

19. A method as claimed in claim 1, wherein the pin structure has a necking region after said step of extruding the ball of material into the bore.

20. A method as claimed in claim 3, wherein the second predetermined time period is at least ten milliseconds.

21. A method as claimed in claim 1, wherein the pin structure has a height greater than the initial diameter of the ball.

* * * * *